(12) United States Patent
Oh

(10) Patent No.: US 10,811,472 B2
(45) Date of Patent: *Oct. 20, 2020

(54) ORGANIC LIGHT EMITTING DISPLAY AND METHOD OF FABRICATING THE SAME

(71) Applicant: LG Display Co., Ltd., Seoul (KR)

(72) Inventor: Jae-Young Oh, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/387,391

(22) Filed: Apr. 17, 2019

(65) Prior Publication Data
US 2019/0252468 A1   Aug. 15, 2019

Related U.S. Application Data

(63) Continuation of application No. 15/457,955, filed on Mar. 13, 2017, now Pat. No. 10,312,298.

(30) Foreign Application Priority Data

Jul. 29, 2016   (KR) ........................ 10-2016-0096714

(51) Int. Cl.
*G09G 5/00* (2006.01)
*H01L 27/32* (2006.01)
(Continued)

(52) U.S. Cl.
CPC ........ *H01L 27/323* (2013.01); *G06F 3/03547* (2013.01); *G06F 3/044* (2013.01);
(Continued)

(58) Field of Classification Search
CPC .... G06F 3/0412; G06F 3/044; G06F 3/03547; G06F 2203/04103; G06F 2203/04112; G06F 2203/04111; H01L 2227/323
(Continued)

(56) References Cited

U.S. PATENT DOCUMENTS 9,626,063 B2   4/2017   Choi
9,710,090 B2   7/2017   Choi
(Continued)

FOREIGN PATENT DOCUMENTS

CN   101661949 A   3/2010
CN   102736777 A   10/2012
(Continued)

OTHER PUBLICATIONS

Extended European Search Report for European Patent Application No. EP 17155530.3, dated Aug. 1, 2017, 8 Pages.
(Continued)

*Primary Examiner* — Jennifer T Nguyen
(74) *Attorney, Agent, or Firm* — Fenwick & West LLP

(57) ABSTRACT

Disclosed are an organic light emitting display, which may achieve weight reduction and slimming, and a method of fabricating the same. An encapsulation part of the organic light emitting display includes a plurality of inorganic encapsulation layers and at least one organic encapsulation layer disposed between the inorganic encapsulation layers, and a plurality of touch electrodes disposed on one of the inorganic encapsulation layers and the at least one organic encapsulation layer of the encapsulation part, each touch electrode having electrically independent self capacitance, thereby achieving weight reduction and slimming of the organic light emitting display.

39 Claims, 18 Drawing Sheets

(51) Int. Cl.
  *G06F 3/0354* (2013.01)
  *G06F 3/041* (2006.01)
  *G06F 3/044* (2006.01)
  *H01L 51/52* (2006.01)
  *H01L 51/56* (2006.01)

(52) U.S. Cl.
  CPC ........ *G06F 3/0412* (2013.01); *H01L 27/3211* (2013.01); *H01L 27/3246* (2013.01); *H01L 27/3276* (2013.01); *H01L 51/5253* (2013.01); *H01L 51/56* (2013.01); *G06F 2203/04103* (2013.01); *G06F 2203/04111* (2013.01); *G06F 2203/04112* (2013.01); *H01L 2227/323* (2013.01)

(58) Field of Classification Search
  USPC ............................... 345/173; 427/97.3, 97.4
  See application file for complete search history.

(56) References Cited

U.S. PATENT DOCUMENTS

| | | | |
|---|---|---|---|
| 9,727,195 B2 | 8/2017 | Kim et al. | |
| 9,965,113 B2* | 5/2018 | Ryu | G06F 3/044 |
| 10,067,587 B2 | 9/2018 | Shepelev | |
| 10,312,298 B2* | 6/2019 | Oh | G06F 3/03547 |
| 2004/0170927 A1 | 9/2004 | Pichler | |
| 2010/0052521 A1 | 3/2010 | Kim et al. | |
| 2012/0262385 A1* | 10/2012 | Kim | G06F 3/044 |
| | | | 345/173 |
| 2014/0145979 A1 | 5/2014 | Lee | |
| 2015/0185940 A1* | 7/2015 | Han | G06F 3/044 |
| | | | 345/174 |
| 2015/0220202 A1* | 8/2015 | Choung | G06F 3/0416 |
| | | | 345/174 |
| 2016/0062520 A1 | 3/2016 | Choi | |
| 2016/0103529 A1 | 4/2016 | Kim et al. | |
| 2016/0124557 A1 | 5/2016 | Choi | |
| 2016/0154499 A1 | 6/2016 | Bae et al. | |
| 2017/0097705 A1 | 4/2017 | Sato et al. | |
| 2017/0179432 A1* | 6/2017 | Visweswaran | H01L 51/5256 |
| 2017/0262109 A1* | 9/2017 | Choi | G06F 3/0412 |

FOREIGN PATENT DOCUMENTS

| | | |
|---|---|---|
| CN | 105390526 A | 3/2016 |
| CN | 105575998 A | 5/2016 |
| KR | 10-2013-0110539 A | 10/2013 |
| KR | 10-2016-0017336 A | 2/2016 |
| KR | 10-2016-0026170 A | 3/2016 |
| WO | WO 2016/002461 A1 | 1/2016 |

OTHER PUBLICATIONS

Korean Intellectual Property Office, Office Action, KR Patent Application No. 10-2018-0101805, Dec. 20, 2018, six pages (with concise explanation of relevance).

Office Action for Korean Patent Application No. KR 10-2016-0096714, dated Nov. 13, 2017, 6 Pages, (With Concise Explanation of Relevance).

United States Office Action, U.S. Appl. No. 15/457,955, dated Oct. 1, 2018, 11 pages.

China National Intellectual Property Administration, First Office Action, CN Patent Application No. 201710091529.2, dated Jul. 1, 2020, 13 pages.

\* cited by examiner

ORGANIC LIGHT EMITTING DISPLAY AND METHOD OF FABRICATING THE SAME

CROSS-REFERENCE TO RELATED APPLICATIONS

This application is a continuation of U.S. patent application Ser. No. 15/457,955 filed on Mar. 13, 2017 which claims priority under 35 U.S.C. § 119(a) to Republic of Korea Patent Application No. 10-2016-0096714, filed on Jul. 29, 2016, each of which is incorporated by reference in its entirety.

BACKGROUND OF THE INVENTION

Field of the Invention

The present invention relates to an organic light emitting display and a method of fabricating the same, and more particularly, to an organic light emitting display which may achieve weight reduction and slimming, and a method of fabricating the same.

Description of the Related Art

A touchscreen is an input device through which a user may input a command by selecting instructions displayed on a screen of a display, using a hand or an object. That is, the touchscreen converts a contact position of a human hand or an object, which directly contacts the touchscreen, into an electrical signal and receives instructions selected at the contact position as an input signal. Such a touchscreen may substitute for a separate input device connected to a display device and operated, such as a keyboard or a mouse, and thus applications of the touchscreen have gradually increased.

In general, a touchscreen is attached to the front surface of a display panel, such as a liquid crystal display panel or an organic electroluminescent display panel. In this case, since the touchscreen is separately manufactured and then attached to the front surface of the display panel, an attachment process is additionally carried out and thus the overall process becomes complicated and manufacturing costs are raised. Further, the overall thickness of the display panel is increased by the touchscreen and it may be difficult to secure flexibility and transmittance due to the increased thickness.

SUMMARY

Accordingly, the present invention is directed to an organic light emitting display and a method of fabricating the same that substantially obviate one or more problems due to limitations and disadvantages of the related art.

An object of the present invention is to provide an organic light emitting display which may achieve weight reduction and slimming, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes light emitting devices disposed on a substrate, an encapsulation layer structure disposed on the light emitting devices, and a touch sensor. The touch sensor may include a plurality of touch sensing electrodes disposed on the encapsulation layer structure along a first direction, and a plurality of touch driving electrodes on the encapsulation layer structure and in a same plane as the plurality of touch sensing electrodes, the plurality of touch driving electrodes disposed along the first direction and in parallel with the plurality of touch sensing electrode. The display device may further include at least one routing line disposed on the encapsulation layer structure and connected to the touch sensor. The at least one routing line is running along at least one sidewall of the encapsulation layer structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
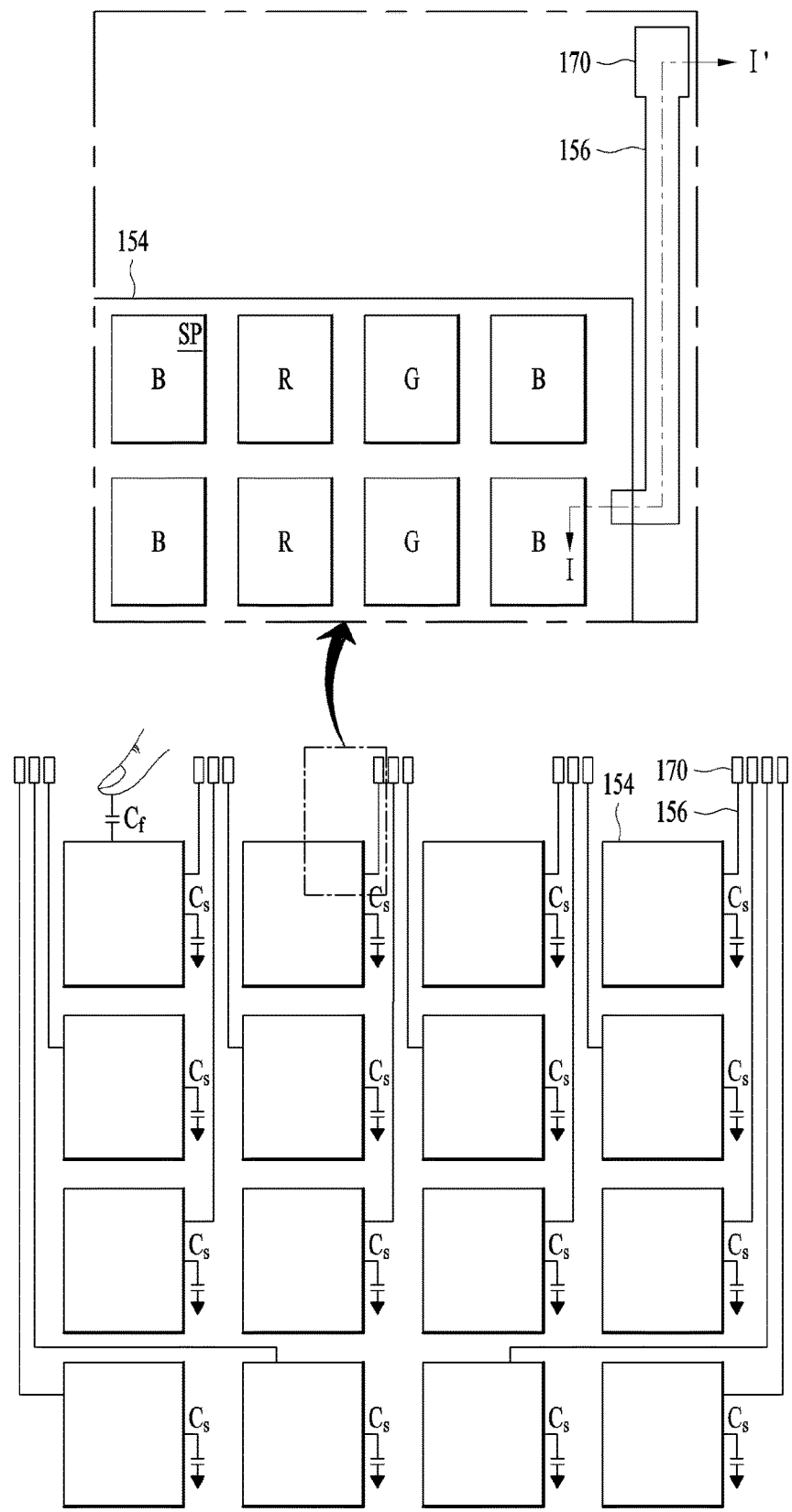
FIG. 1 is a plan view of an organic light emitting display having touch sensors in accordance with one embodiment of the present invention.
Figure 2:
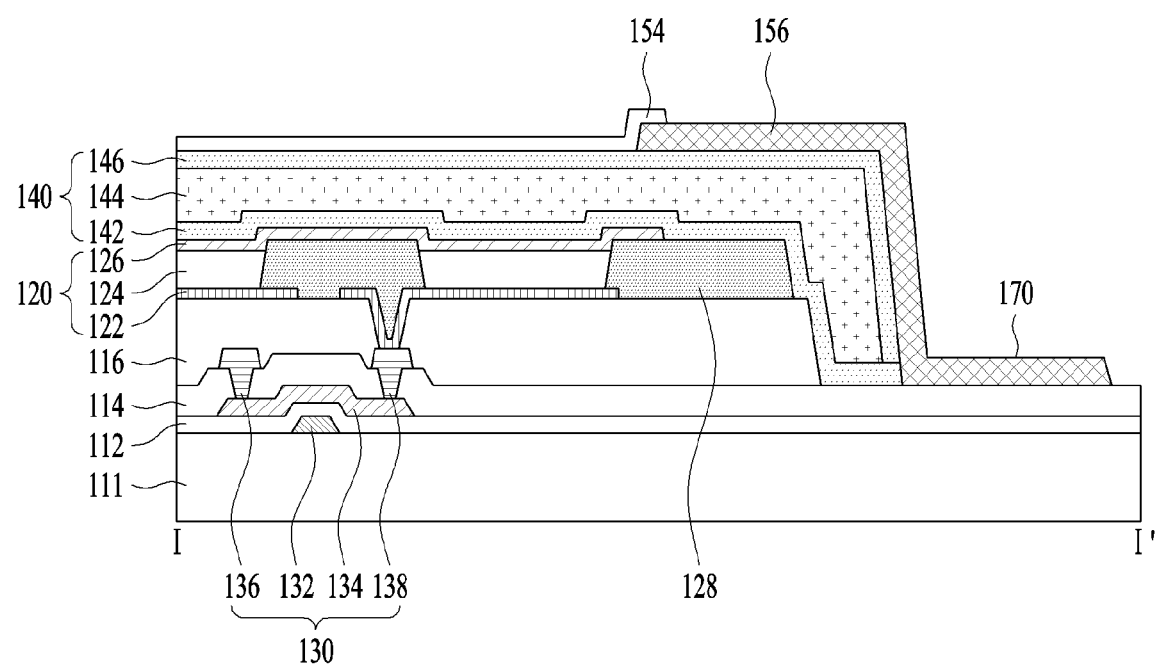
FIG. 2 is a cross-sectional view of the organic light emitting display, taken along line I-I' of FIG. 1.

FIGS. 1 and 2 are plan and cross-sectional views of an organic light emitting display having touch sensors in accordance with one embodiment.

An organic light emitting display having touch sensors shown in FIGS. 1 and 2 includes a plurality of sub-pixels SP and touch electrodes corresponding to the sub-pixels SP many-to-one. That is, one touch electrode may correspond to a plurality of sub-pixels SP. For example, one touch electrode may overlap a plurality of sub-pixels SP.

The sub-pixels SP are arranged in a matrix and display an image. Red (R), green (G) and blue (B) sub-pixels SP form one unit pixel, as exemplarily shown in FIG. 1, or red (R), green (G), blue (B) and white (W) sub-pixels SP form one unit pixel.

Each sub-pixel SP includes at least one switching thin film transistor (not shown), at least one driving thin film transistor 130, a light emitting device 120, and an encapsulation part 140.

Each of the switching thin film transistor and the driving thin film transistor 130 is formed on a lower substrate 111 formed of plastic or glass.

The switching thin film transistor is connected to a gate line (not shown) and a data line (not shown) at an intersection therebetween, and the driving thin film transistor 130 is connected to the switching thin film transistor and a power line (not shown).

The driving thin film transistor 130, as exemplarily shown in FIG. 2, includes a gate electrode 132, a semiconductor layer 134 overlapping the gate electrode 132 with a gate insulating layer 112 interposed therebetween, and source electrode 136 and drain electrode 138 formed on an interlayer insulating layer 114 and contacting the semiconductor layer 134.

The light emitting device 120 includes an anode 122, an organic light emitting layer 124 formed on the anode 122, and a cathode 126 formed on the organic light emitting layer 124.

The anode 122 is conductively connected to the drain electrode 138 of the driving thin film transistor 130 exposed through a pixel contact hole formed through a passivation layer 116. The organic light emitting layer 124 is formed on the anode 122 in an emission region provided by a bank 128. The organic light emitting layer 124 is formed by stacking a hole-related layer (e.g., hole transport layer), a light emitting layer and an electron-related layer (e.g., electron transport layer) on the anode 122 in regular order or in reverse order. The cathode 126 is formed opposite the anode 122 with the organic light emitting layer 124 interposed therebetween.

The encapsulation part 140 prevents external moisture or oxygen from penetrating into the light emitting device 120, which is vulnerable to external moisture or oxygen. For this purpose, the encapsulation part 140 includes a plurality of inorganic encapsulation layers 142 and 146 and an organic encapsulation layer 144 disposed between the inorganic encapsulation layers 142 and 146, and the inorganic encapsulation layer 146 is disposed as the uppermost layer of the encapsulation part 140. Here, the encapsulation part 140 includes at least two inorganic encapsulation layers 142 and 146 and at least one organic encapsulation layer 144. In the present invention, the structure of the encapsulation part 140 in which the organic encapsulation layer 144 is disposed between the first and second inorganic encapsulation layers 142 and 146 will be exemplarily described.

The first encapsulation layer 142 is formed on the substrate 111 provided with the cathode 126 to be located most adjacent to the light emitting device 120 (in other words, of the three encapsulation layers 142, 144, 146, the first inorganic encapsulation layer 142 is located closest to the light emitting device 120). The first inorganic encapsulation layer 142 is formed to expose a pad region in which a touch pad 170 will be formed. Such a first inorganic encapsulation layer 142 is formed to have a monolayer or multilayer structure using an inorganic insulating material which may be deposited at a low temperature, such as silicon nitride (SiNx), silicon oxide (SiOx), silicon oxynitride (SiON) or aluminum oxide (Al2O3). Therefore, damage to the organic light emitting layer 124 by a high-temperature atmosphere during a deposition process of the first inorganic encapsulation layer 142 may be prevented.

The organic encapsulation layer 144 is formed to have a smaller area than that of the first inorganic encapsulation layer 142 and exposes both ends (in other words, opposite lateral ends) of the first inorganic encapsulation layer 142. The organic encapsulation layer 144 serves as a buffer to damp stress between respective layers according to bending of the organic light emitting display and strengthens planarization performance of the organic light emitting display. The organic encapsulation layer 144 is formed to have a monolayer or multilayer structure using an organic insulating material, such as acrylic resin, epoxy resin, a polymeric resin (such as polyimide or polyethylene) or silicon oxycarbide (SiOC).

The second inorganic encapsulation layer 146 is formed on the substrate 111 provided with the organic encapsulation layer 144 formed thereon to cover the upper and side surfaces of the organic encapsulation layer 144 and the first inorganic encapsulation layer 142. Therefore, the second inorganic encapsulation layer 146 minimizes or blocks penetration of external moisture or oxygen into the first inorganic encapsulation layer 142 and the organic encapsulation layer 144. Such a second inorganic encapsulation layer 146 is formed to have a monolayer or multilayer structure using an inorganic insulating material, such as silicon nitride (SiNx), silicon oxide (SiOx), silicon oxynitride (SiON) or aluminum oxide (Al2O3).

A plurality of touch electrodes 154 is formed on at least one of the first and second inorganic encapsulation layers 142 and 146 and the organic encapsulation layer 144. In this embodiment, a structure in which a plurality of touch electrodes 154 is formed on the second inorganic encapsulation layer 146 serving as the uppermost layer of the encapsulation part 140 will be exemplarily described.

Each of the touch electrodes 154 includes capacitance formed therein and is thus used as a self-capacitive touch sensor Cs which senses change in capacitance by user touch. In a self-capacitive sensing method using such touch electrodes 154, when a driving signal supplied through the touch pad 170 is applied to the touch electrode 154 using the routing line 156, charges Q are accumulated in the touch sensor Cs. When a user's finger or a conductive object touches the touch electrode 154, parasitic capacitance Cf is additionally connected to the self-capacitive sensor Cs and thus a capacitance value is changed. Therefore, a difference in capacitance values between the touch sensor Cs which the finger touches and other touch sensors Cs occurs and thereby whether or not touch occurs may be judged.

For this purpose, the touch electrodes 154 are divided from each other in first and second directions intersecting each other and are thus independently formed. Each of the touch electrodes 154 is formed to have a size corresponding to the overall size of a plurality of light emitting devices in consideration of a user touch area. For example, one touch electrode 154 corresponding to the overall size of 8 light emitting devices arranged in the first direction×8 light emitting devices arranged in the second direction forms one touch sensor Cs.

Further, each of the touch electrodes 154 is connected to a touch driver (not shown) through the routing line 156 and the touch pad 170.

Further, each of the routing lines 156 is formed in one of the first and second directions and is connected to each of the touch electrodes 154 one-to-one (in other words, the routing lines 156 are connected to the touch electrodes 154 in a one-to-one relation; in still other words, each routing line 156 is connected to a respective touch electrode 154). Among the routing lines 156, the routing lines 156 located between the touch electrodes 154 are disposed to (laterally) overlap the bank 128, and the remaining routing lines 156 located at one side or the other side of the outermost touch electrodes 154 are disposed in a bezel area. Therefore, lowering of an aperture ratio by the routing lines 156 may be prevented.

Further, the routing lines 156 are disposed on the upper and side surfaces of the second inorganic encapsulation layer 146, i.e., the uppermost layer of the encapsulation part 140. Therefore, even if external oxygen or moisture penetrates through the routing lines 156, the organic encapsulation layer 144 and the first and second inorganic encapsulation layers 142 and 146 block oxygen or moisture and may thus protect the organic light emitting layer 124 from oxygen or moisture.

The touch pad 170 is formed to have a monolayer structure or a multilayer structure using metals having high corrosion resistance and high acid resistance, such as Ta, Al, Ti, Cu and Mo, in the same manner as the routing lines 156. That is, the touch pad 170 may have a monolayer structure or multilayer structure including one or more of Ta, Al, Ti, Cu and Mo. For example, the touch pad 170 has a multilayer structure in which a metal having high corrosion resistance and high acid resistance is disposed at the uppermost layer, such as a tri-layer structure such as Ti/Al/Ti or Mo/Al/Mo.

The touch pad 170 is disposed in a pad region of the substrate 111 exposed from the encapsulation part 140 (in other words, the pad region is uncovered by the encapsulation part 140; in still other words, the pad region is free from the encapsulation part 140). Such a touch pad 170 extends from the routing line 156 and is connected to the routing line 156, thus supplying a touch signal (from a touch driver) to the touch electrode 154 through the routing line 156. Further, the touch pad 170 receives a touch signal, sensed by the touch electrode 154, through the routing line 156 and supplies the touch signal to the touch driver connected to the touch pad 170. The touch driver detects whether or not user touch occurs and a touch position by sensing change in capacitance due to the user touch.

As such, in the organic light emitting display in accordance with this embodiment, the touch electrode 154 is disposed on the second inorganic encapsulation layer 146 of the encapsulation part 140. In this case, the organic light emitting display does not require a separate touch insulating layer, and may thus achieve structure simplification, weight reduction and slimming and assure flexibility and transmittance. Further, while a touchscreen is attached to a conventional organic light emitting display by an adhesive, in the organic light emitting display in accordance with some embodiments of the present invention, the touch electrodes 154 are disposed on the second inorganic encapsulation layer 146 of the encapsulation part 140 without a separate attachment process and thus the overall fabrication process may be simplified and manufacturing costs may be reduced.

Figure 3A:
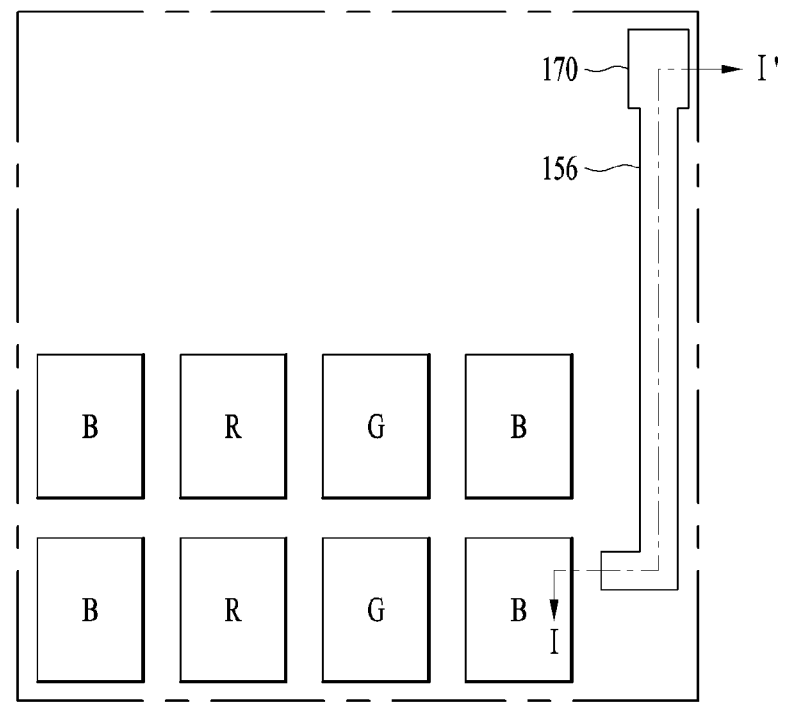
FIGS. 3A and 3B are plan and cross-sectional views illustrating a method of fabricating the organic light emitting display shown in FIGS. 1 and 2.
Figure 3A:
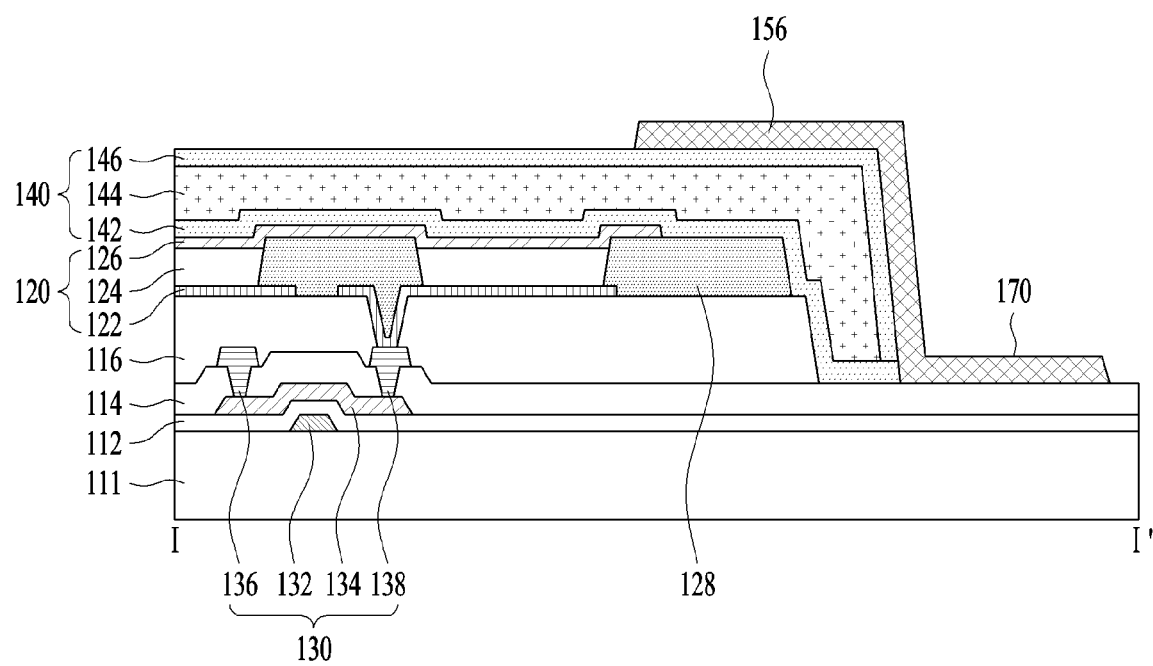
Figure 3B:
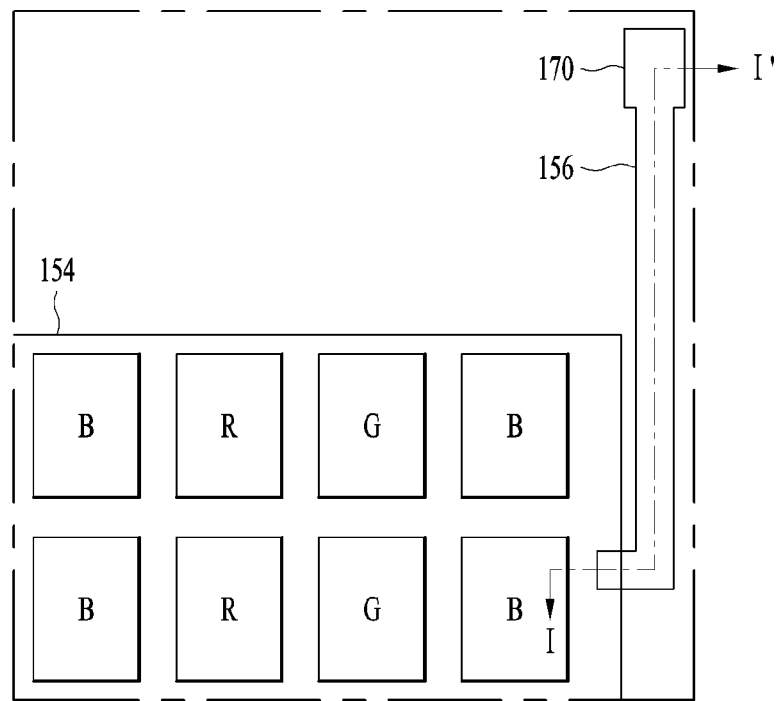
Figure 3B:
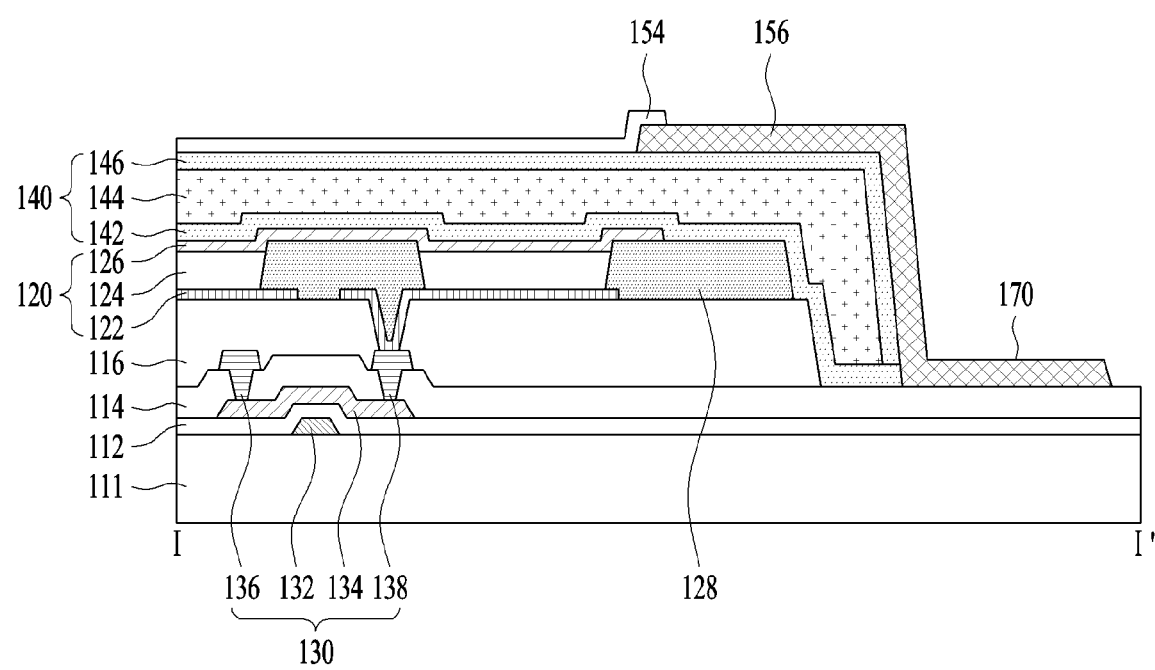

FIGS. 3A and 3B are plan and cross-sectional views illustrating a method of fabricating the organic light emitting display shown in FIGS. 1 and 2.

With reference to FIG. 3A, the first inorganic encapsulation layer 142, the organic encapsulation layer 144 and the second inorganic encapsulation layer 146 are sequentially formed on the substrate 111 provided with the switching thin film transistors, the driving thin film transistors 130, the anodes 122, the organic light emitting layer 124 and the cathodes 126 formed thereon, the routing lines 156 are formed on the second inorganic encapsulation layer 146, and the touch pads 170 are formed so as to extend from the routing lines 156.

In more detail, the first inorganic encapsulation layer 142, the organic encapsulation layer 144 and the second inorganic encapsulation layer 146 are sequentially formed by sequentially stacking an inorganic insulating material, an organic insulating material and an inorganic insulating material on the substrate 111, provided with the switching thin film transistors, the driving thin film transistors 130, the anodes 122, the organic light emitting layer 124 and the cathodes 126 formed thereon, through a deposition process using a mask, e.g. a metal mask. Here, the first inorganic encapsulation layer 142, the organic encapsulation layer 144 and the second inorganic encapsulation layer 146 are formed in other regions except for regions in which the touch pads 170 will be formed (in other words, the encapsulations layers 142, 144, 146 may be deposited over the entire area of the display except for the regions where the touch pads 170 will be formed).

Thereafter, a first conductive layer is deposited on the whole surface of the second inorganic encapsulation layer 146, and the routing lines 156 and the touch pads 170 are formed by patterning the first conductive layer through a photolithography process and an etching process. Here, the first conductive layer is formed to have a monolayer structure or a multilayer structure using metals having high corrosion resistance and high acid resistance, such as Ta, Al, Ti, Cu and Mo. That is, the first conductive layer may have a monolayer structure or multilayer structure including one or more of Ta, Al, Ti, Cu and Mo. For example, the first conductive layer has a tri-layer structure, such as Ti/Al/Ti or Mo/Al/Mo.

With reference to FIG. 3B, the touch electrodes 154 are formed on the substrate 111 provided with the routing lines 156 and the touch pads 170 formed thereon.

In more detail, a second conductive layer is deposited on the whole surface of the substrate 111 provided with the routing lines 156 and the touch pads 170 formed thereon, and the touch electrodes 154 are formed by patterning the second conductive layer through a photolithography process and an etching process. Here, the second conductive layer employs a transparent conductive layer, such as ITO, IZO, IGZO or ZnO.

Figure 4:
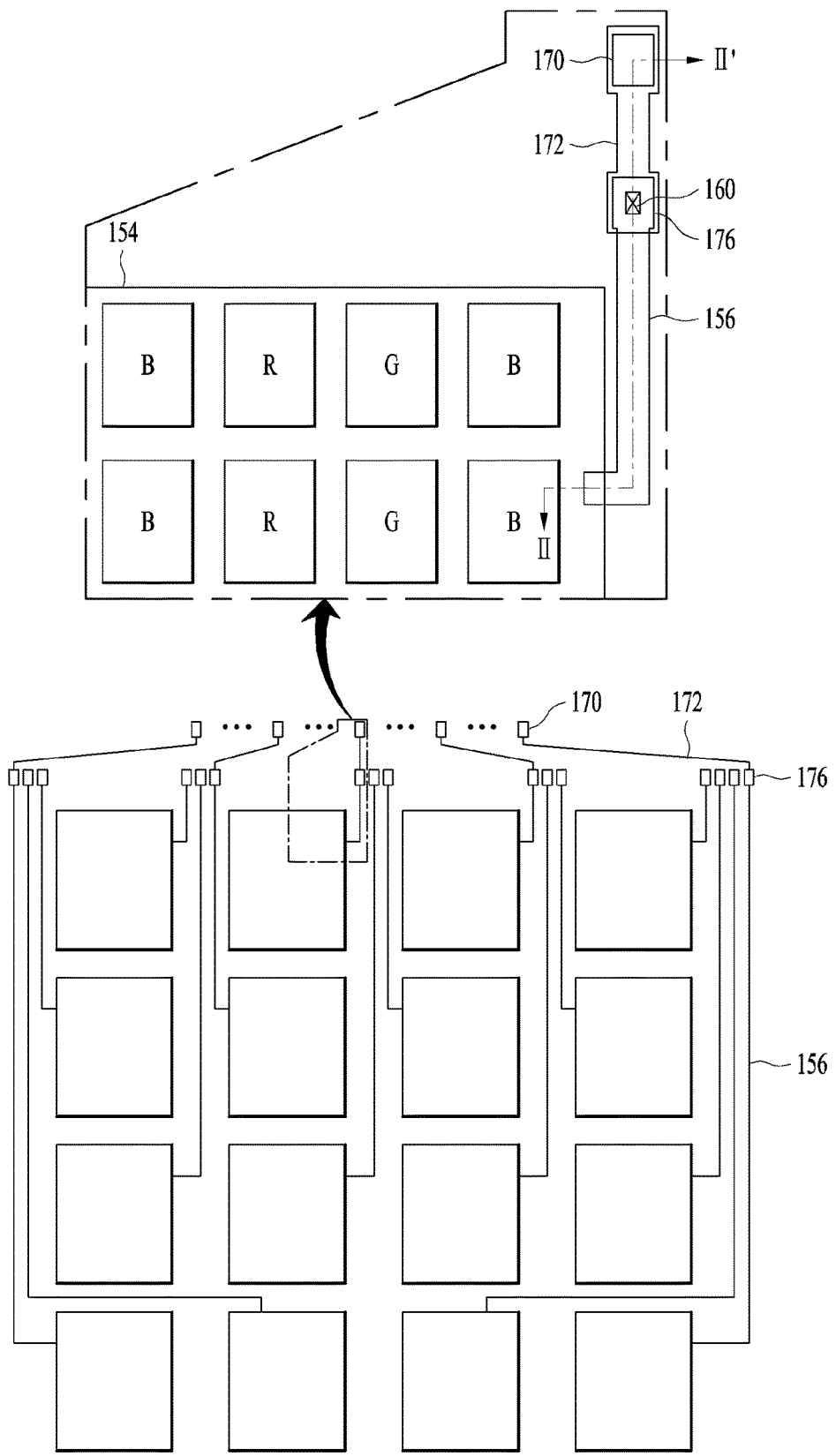
FIG. 4 is a plan view of an organic light emitting display having touch sensors in accordance with a further embodiment of the present invention.
Figure 5:
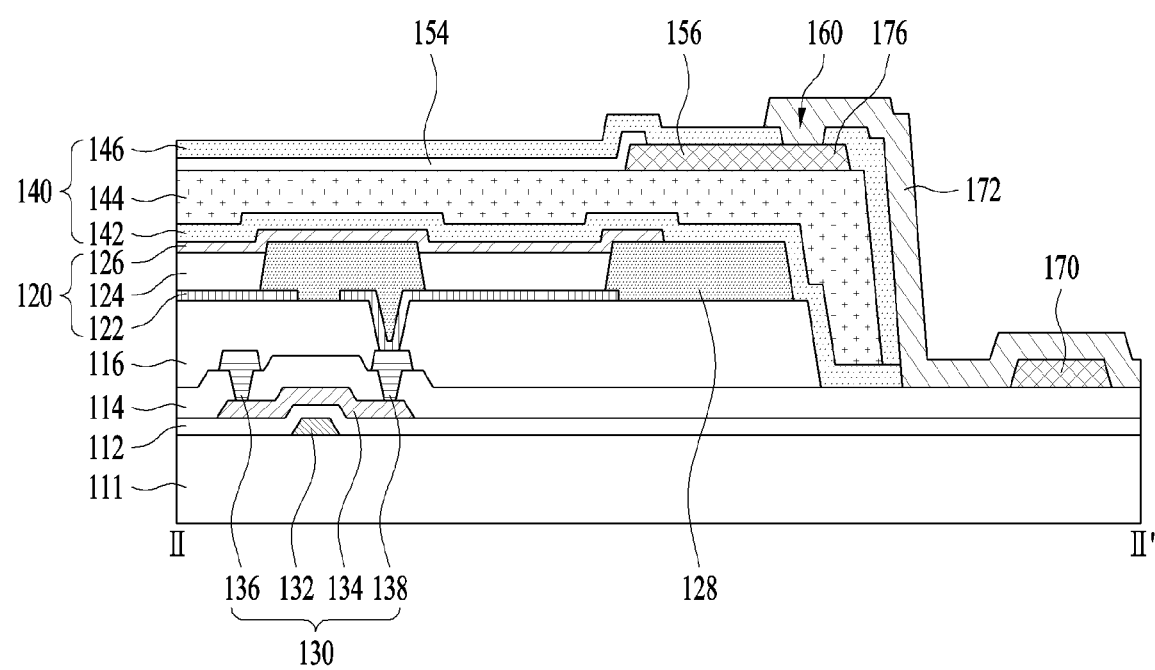
FIG. 5 is a cross-sectional view of the organic light emitting display, taken along line II-II' of FIG. 4.

FIG. 4 is a plan view of an organic light emitting display having touch sensors in accordance with a further embodiment of the present invention and FIG. 5 is a cross-sectional view of the organic light emitting display, taken along line II-II' of FIG. 4.

The organic light emitting display shown in FIGS. 4 and 5 is the same as the organic light emitting display shown in FIGS. 1 and 2, except that touch electrodes 154 are disposed on an organic encapsulation layer 144 and routing pads 176 are disposed between routing lines 156 and touch pads 170.

Therefore, a detailed description of elements of the organic light emitting display shown in FIGS. 4 and 5, which are substantially the same as those of the organic light emitting display shown in FIGS. 1 and 2, will be omitted because it is considered to be unnecessary.

The touch electrodes 154, the routing lines 156 and the routing pads 176 are disposed on the organic encapsulation layer 144.

The routing pads 176 are disposed between the routing lines 156 and the touch pads 170 and conductively connect the routing lines 156 and the touch pads 170 to each other. The routing pads 176 extend from the routing lines 156 and are thus formed of the same material as the routing lines 156, while being coplanar with the routing lines 156. The routing pads 176 are exposed through pad contact holes 160 formed through the second inorganic encapsulation layer 146.

The touch pads 170 are formed of the same material as the routing lines 156 on at least one of a substrate 111, a gate insulating layer 112 and an interlayer insulating layer 114, exposed from an encapsulation part 140 (in other words, uncovered by the encapsulation part 140; in still other words, free from the encapsulation part 140). The touch pad 170 is directly connected to a pad connection electrode 172 formed on at least one of the upper and side surfaces of the touch pad 170. The touch pad 170 is conductively connected to the routing pad 176, exposed through the pad contact hole 160, through the pad connection electrode 172.

Particularly, the pad connection electrode 172 is disposed on the upper and side surfaces of the second inorganic encapsulation layer 146 as the uppermost layer of the encapsulation part 140. Therefore, even if external oxygen or moisture penetrates through the pad connection electrode 172, the organic encapsulation layer 144 and the first and second inorganic encapsulation layers 142 and 146 block oxygen or moisture and may thus protect the organic light emitting layer 124 from oxygen or moisture.

Here, the pad connection electrode 172 is formed of a transparent conductive oxide such as an ITO, IZO, IGZO or ZnO-based transparent conductive oxide, or is formed to have a monolayer structure or a multilayer structure using metals having high corrosion resistance and high acid resistance, such as Ti, Ta and Mo. For example, the pad connection electrode 172 has a tri-layer structure, such as Ti/Al/Ti or Mo/Al/Mo.

As such, in the organic light emitting display in accordance with this embodiment of the present invention, the touch electrode 154 is disposed on the organic encapsulation layer 144 of the encapsulation part 140. In this case, the organic light emitting display in accordance with the present invention does not require a separate touch insulating layer, and may thus achieve structure simplification, weight reduction and slimming and assure flexibility and transmittance. Further, while a touchscreen is attached to a conventional organic light emitting display by an adhesive, in the organic light emitting display in accordance with some embodiments of the present invention, the touch electrodes 154 are disposed on the organic encapsulation layer 144 of the encapsulation part 140 without a separate attachment process and thus the overall fabrication process may be simplified and manufacturing costs may be reduced.

FIGS. 6A to 6D are plan and cross-sectional views illustrating a method of fabricating the organic light emitting display shown in FIGS. 4 and 5.

Figure 6A:
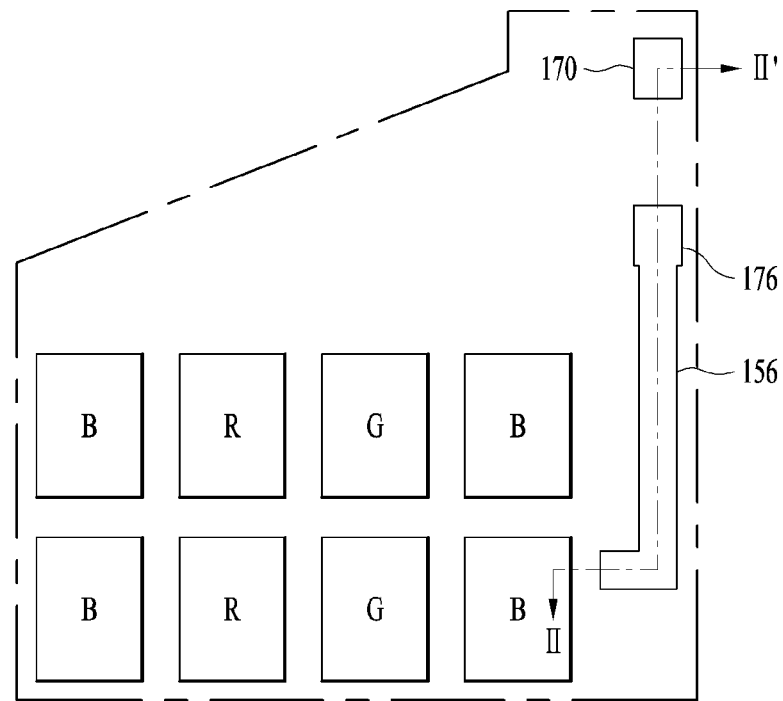
FIGS. 6A to 6D are plan and cross-sectional views illustrating a method of fabricating the organic light emitting display shown in FIGS. 4 and 5.
Figure 6A:
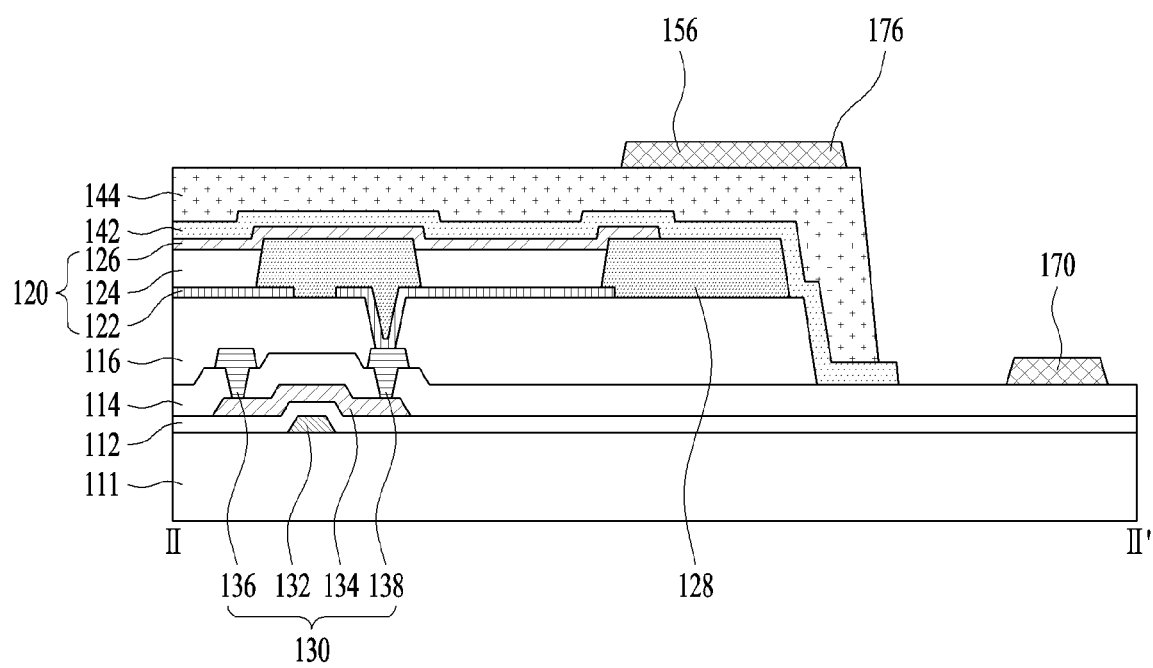

With reference to FIG. 6A, the first inorganic encapsulation layer 142 and the organic encapsulation layer 144 are sequentially formed on the substrate 111 provided with the switching thin film transistors, the driving thin film transistors 130, the anodes 122, the organic light emitting layer 124 and the cathodes 126 formed thereon, the touch pads 170 are formed on at least one of the substrate 111, the gate insulating layer 112 and the interlayer insulating layer 114, and the routing pads 176 and the routing lines 156 are formed on the organic encapsulation layer 144.

In more detail, the first inorganic encapsulation layer 142 and the organic encapsulation layer 144 are formed by sequentially stacking an inorganic insulating material and an organic insulating material on the substrate 111, provided with the switching thin film transistors, the driving thin film transistors 130, the anodes 122, the organic light emitting layer 124 and the cathodes 126 formed thereon, through a deposition process using a mask, for example a metal mask. Here, the first inorganic encapsulation layer 142 and the organic encapsulation layer 144 are formed in other regions except for regions in which the touch pads 170 will be formed. Thereafter, a first conductive layer is deposited on the whole surface of the organic encapsulation layer 144 and on exposed regions of the substrate 111, gate insulating layer 112 and/or interlayer insulating layer 114, and the touch pads 170, the routing pads 176 and the routing lines 156 are formed by patterning the first conductive layer through a photolithography process and an etching process. Here, the first conductive layer is formed to have a monolayer structure or a multilayer structure using metals having high corrosion resistance and high acid resistance, such as Ta, Al, Ti, Cu and Mo. That is, the first conductive layer may have a monolayer structure or multilayer structure including one or more of Ta, Al, Ti, Cu and Mo. For example, the first conductive layer has a tri-layer structure, such as Ti/Al/Ti or Mo/Al/Mo.

Figure 6B:
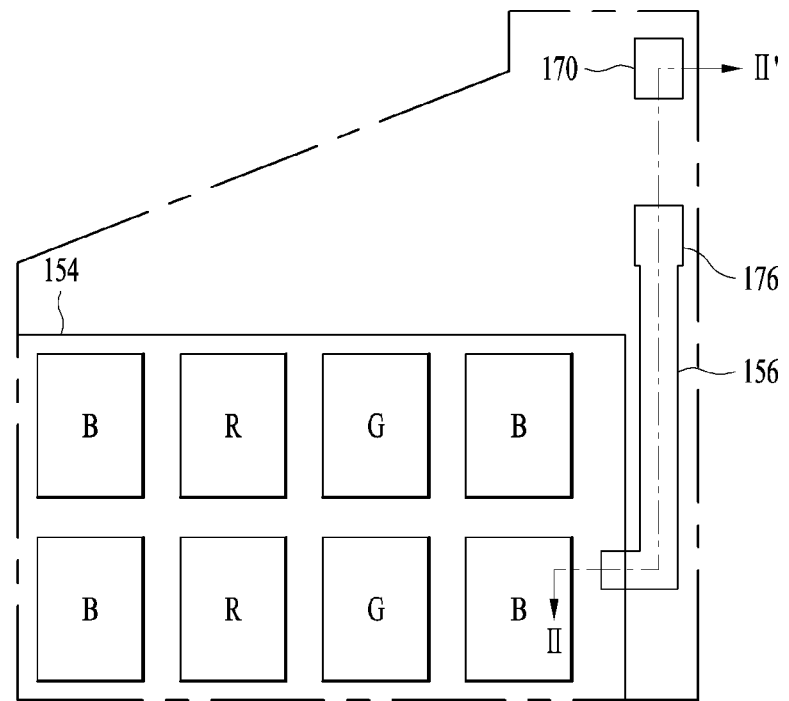
Figure 6B:
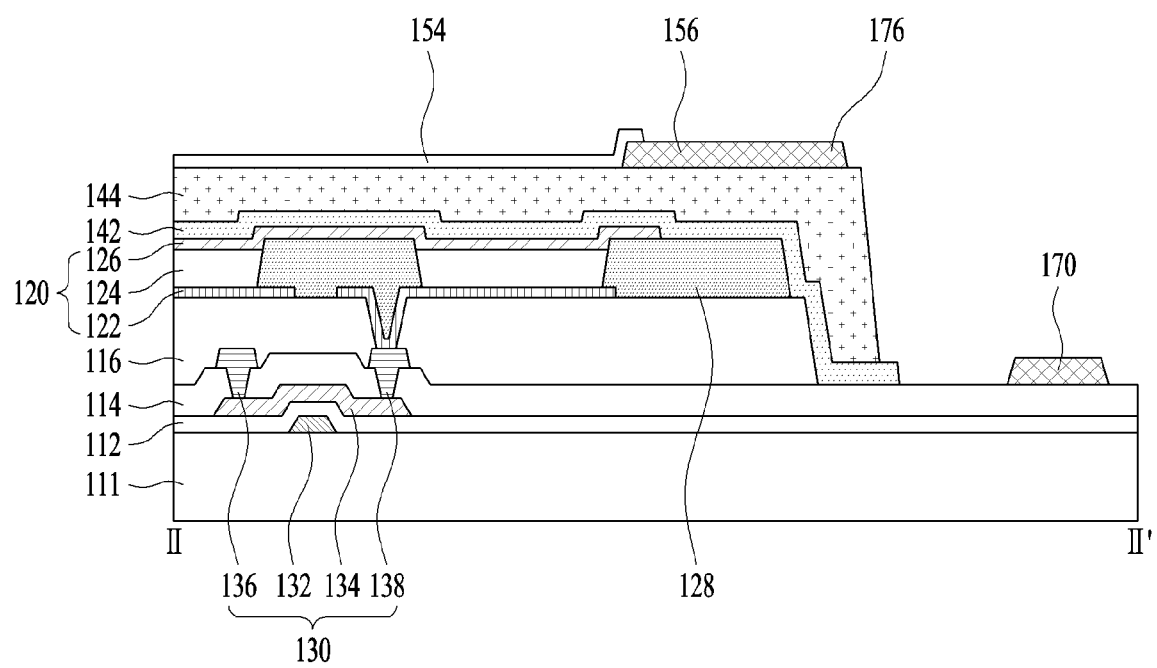

With reference to FIG. 6B, the touch electrodes 154 are formed on the substrate 111 provided with the touch pads 170, the routing pads 176 and the routing lines 156 formed thereon. In particular, the touch electrodes 154 may be formed on the organic encapsulation layer 144 so as to partially overlap the routing pads 176.

In more detail, a second conductive layer is deposited on the whole surface of the substrate 111 provided with the touch pads 170, the routing pads 176 and the routing lines 156 formed thereon, and the touch electrodes 154 are formed by patterning the second conductive layer through a photolithography process and an etching process. Here, the second conductive layer employs an ITO, IZO, IGZO or ZnO-based transparent conductive layer.

Figure 6C:
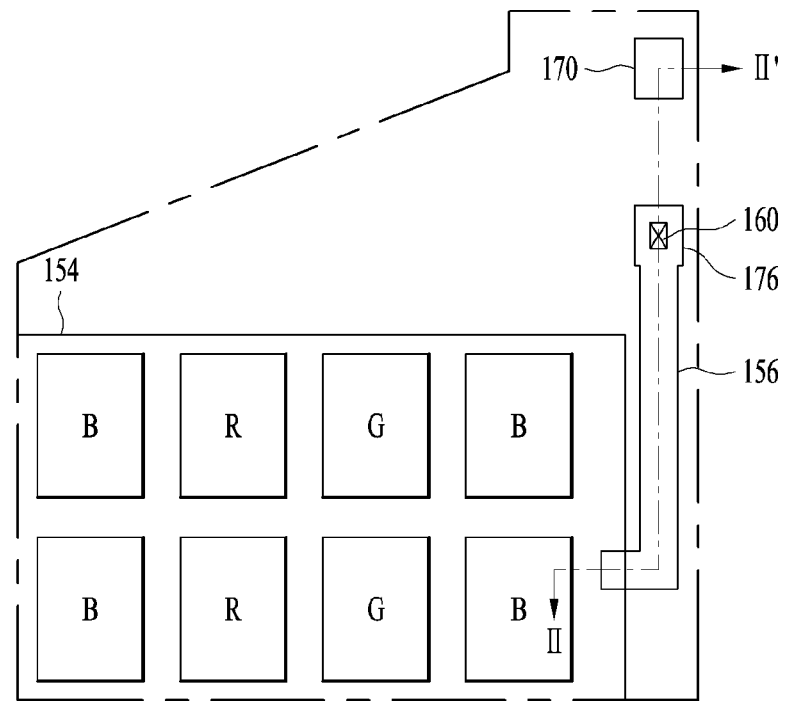
Figure 6C:
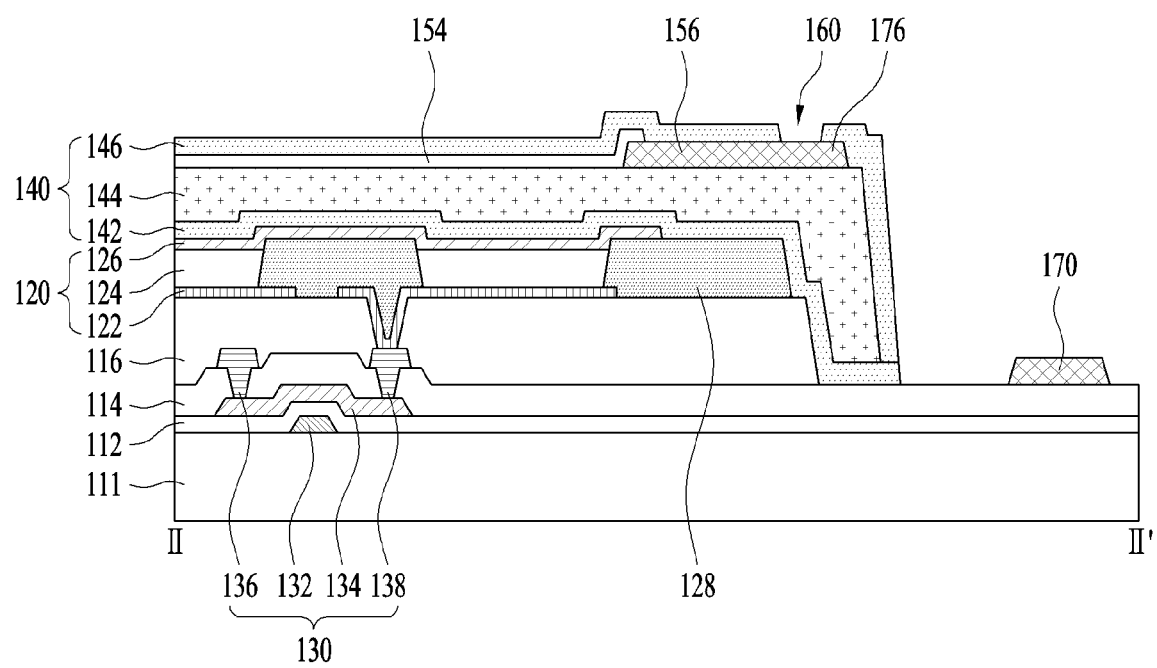

With reference to FIG. 6C, the second inorganic encapsulation layer 146 having the pad contact holes 160 is formed on the substrate 111 provided with the touch electrodes 154 formed thereon.

In more detail, the second inorganic encapsulation layer 146 is formed by depositing an inorganic insulating material on the substrate 111 provided with the touch electrodes 154 formed thereon through a deposition process using a mask, e.g. a metal mask, to expose the touch pads 170. Thereafter, the pad contact holes 160 are formed by patterning the second inorganic encapsulation layer 146 through a photolithography process and an etching process. The pad contact holes 160 are formed through the second inorganic encapsulation layer 146 and thus expose the routing pads 176.

Figure 6D:
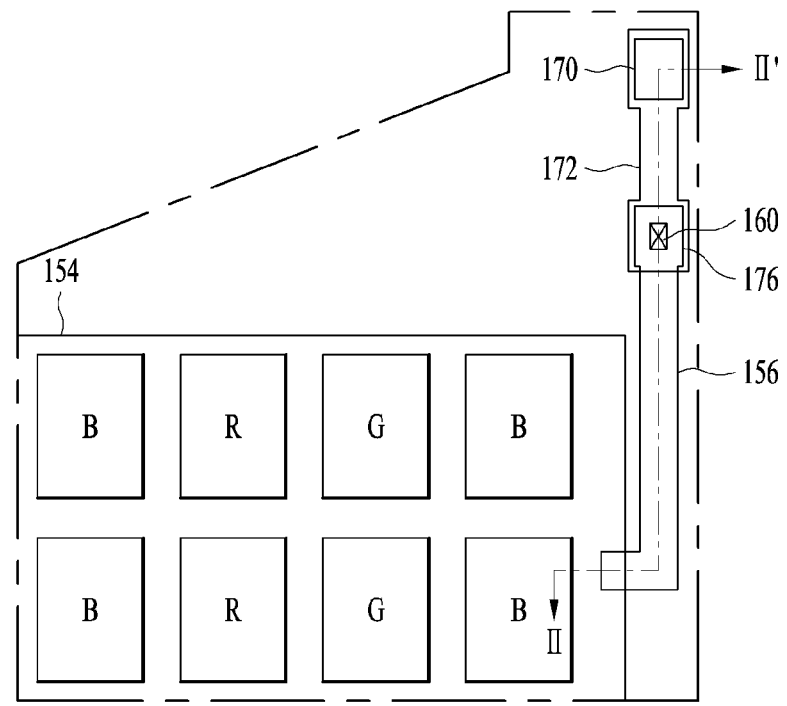
Figure 6D:
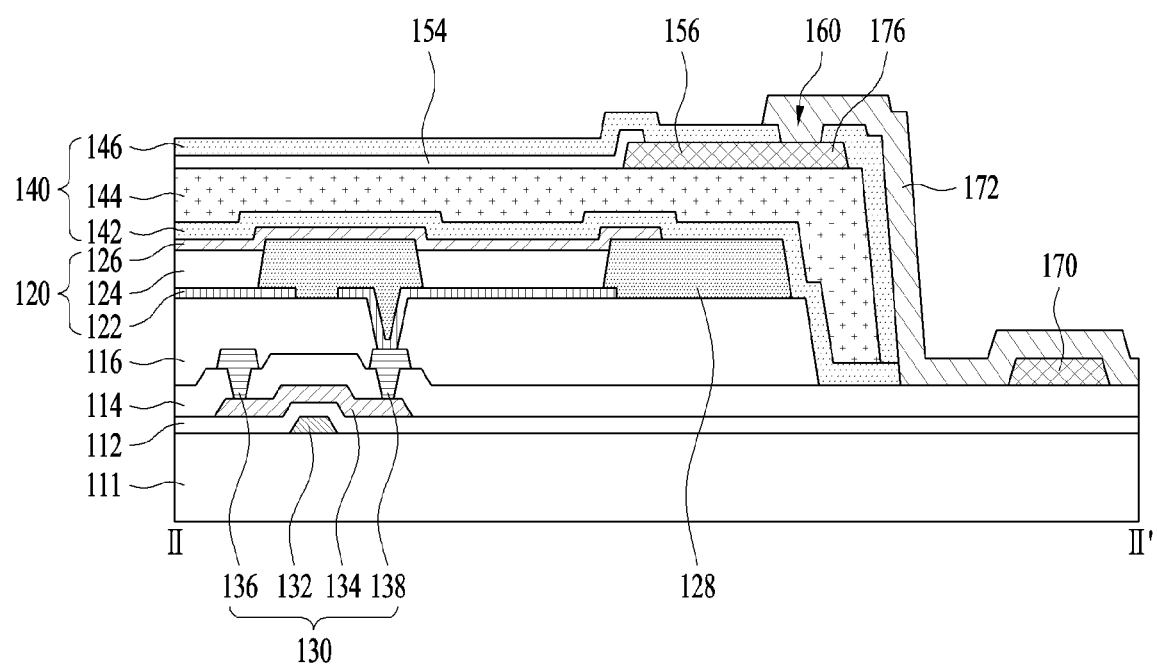

With reference to FIG. 6D, the pad connection electrodes 172 are formed on the substrate 111 provided with the second inorganic encapsulation layer 146 formed thereon.

In more detail, a third conductive layer is deposited on the whole surface of the substrate 111 provided with the second inorganic encapsulation layer 146 formed thereon, and the pad connection electrodes 172 are formed by patterning the third conductive layer through a photolithography process and an etching process. Here, the pad connection electrodes 172 are conductively connected to the routing pads 176 exposed through the pad contact holes 160, and are directly connected to the touch pads 170 without contact holes. Here, the third conductive layer is formed of a transparent conductive oxide such as an ITO, IZO, IGZO or ZnO-based transparent conductive oxide, or is formed to have a monolayer structure or a multilayer structure using metals having high corrosion resistance and high acid resistance, such as Ta, Al, Ti, Cu and Mo. That is, the third conductive layer may have a monolayer structure or multilayer structure including one or more of Ta, Al, Ti, Cu and Mo. For example, the third conductive layer has a tri-layer structure, such as Ti/Al/Ti or Mo/Al/Mo.

Figure 7:
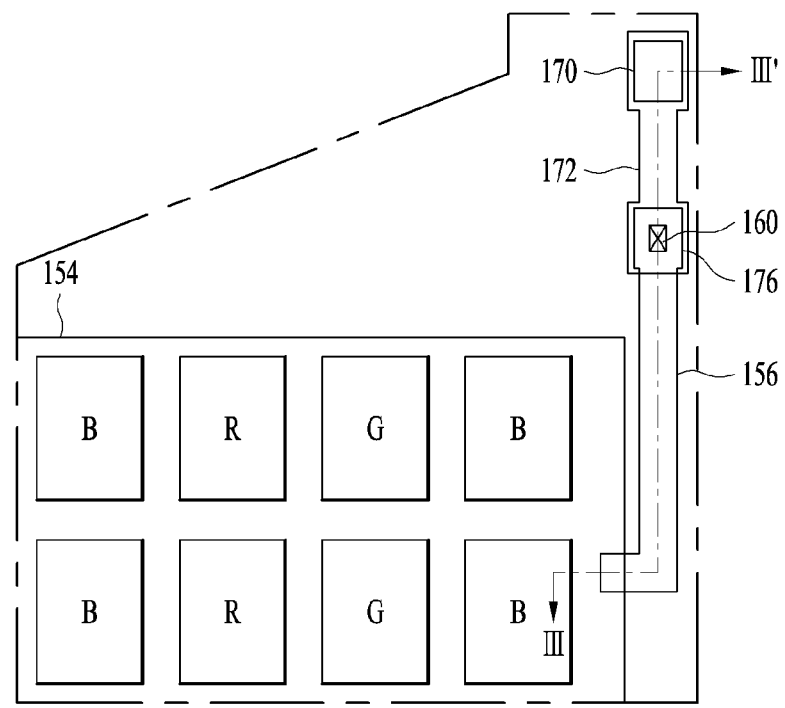
FIG. 7 illustrates plan and cross-sectional views of an organic light emitting display having touch sensors in accordance with another embodiment of the present invention.
Figure 7:
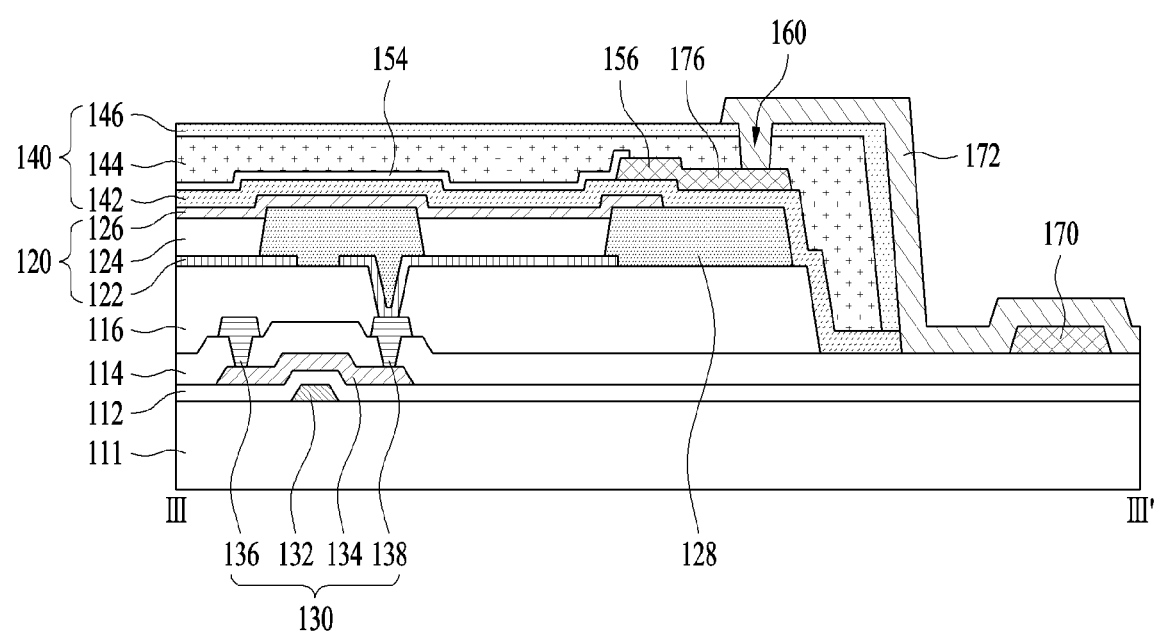

FIG. 7 illustrates plan and cross-sectional views of an organic light emitting display having touch sensors in accordance with another embodiment of the present invention.

The organic light emitting display shown in FIG. 7 is the same as the organic light emitting display shown in FIGS. 4 and 5, except that touch electrodes 154, routing lines 156 and routing pads 176 are disposed on a first inorganic encapsulation layer 142. Therefore, a detailed description of elements of the organic light emitting display shown in FIG. 7, which are substantially the same as those of the organic light emitting display shown in FIGS. 4 and 5, will be omitted because it is considered to be unnecessary.

The touch electrodes 154, the routing lines 156 and the routing pads 176 are disposed on the first inorganic encapsulation layer 142.

The routing pads 176 extend from the routing lines 156 and are thus formed of the same material as the routing lines 156, while being coplanar with the routing lines 156 (or at least substantially coplanar; for example, the routing lines 156 and routing pads 176 may conform to steps of the underlying first inorganic encapsulation layer 142, as shown in FIG. 7). The routing pads 176 are exposed through pad contact holes 160 formed through the organic encapsulation layer 144 and the second inorganic encapsulation layer 146.

The touch pads 170 are formed of the same material as the routing lines 156 on at least one of a substrate 111, a gate insulating layer 112 and an interlayer insulating layer 114, exposed from an encapsulation part 140 (in other words, uncovered by the encapsulation part 140; in still other words, free from the encapsulation part 140). The touch pad 170 is directly connected to a pad connection electrode 172 formed on at least one of the upper and side surfaces of the touch pad 170. The touch pad 170 is conductively connected to the routing pad 176, exposed through the pad contact hole 160, through the pad connection electrode 172.

Particularly, the pad connection electrode 172 is disposed on the upper and side surfaces of the second inorganic encapsulation layer 146 as the uppermost layer of the encapsulation part 140. Therefore, even if external oxygen or moisture penetrates through the pad connection electrode 172, the organic encapsulation layer 144 and the first and second inorganic encapsulation layers 142 and 146 block oxygen or moisture and may thus protect the organic light emitting layer 124 from oxygen or moisture.

Here, the pad connection electrode 172 is formed of a transparent conductive oxide such as an ITO, IZO, IGZO or ZnO-based transparent conductive oxide, or is formed to have a monolayer structure or a multilayer structure using metals having high corrosion resistance and high acid resistance, such as Ta, Al, Ti, Cu and Mo. That is, the pad connection electrode 172 may have a monolayer structure or multilayer structure including one or more of Ta, Al, Ti, Cu and Mo. For example, the pad connection electrode 172 has a tri-layer structure, such as Ti/Al/Ti or Mo/Al/Mo.

As such, in the organic light emitting display in accordance with this embodiment of the present invention, the touch electrode 154 is disposed on the first inorganic encapsulation layer 142 of the encapsulation part 140. In this case, the organic light emitting display does not require a separate touch insulating layer, and may thus achieve structure simplification, weight reduction and slimming and assure flexibility and transmittance. Further, while a touchscreen is attached to a conventional organic light emitting display by an adhesive, in the organic light emitting display in accordance with some embodiments of the present invention, the touch electrodes 154 are disposed on the first inorganic encapsulation layer 142 of the encapsulation part 140 without a separate attachment process and thus the overall fabrication process may be simplified and manufacturing costs may be reduced.

FIGS. 8A to 8D are plan and cross-sectional views illustrating a method of fabricating the organic light emitting display shown in FIG. 7.

Figure 8A:
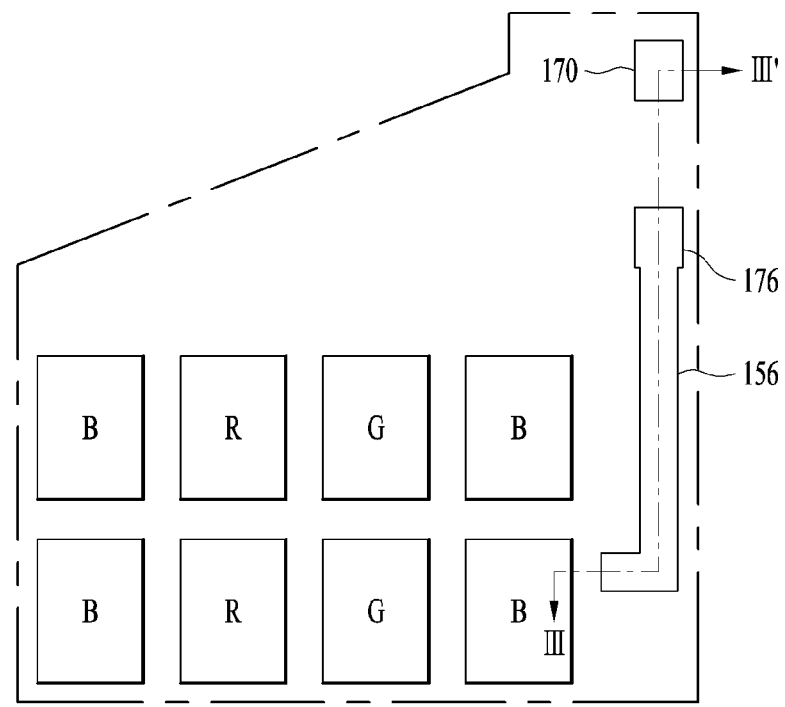
FIGS. 8A to 8D are plan and cross-sectional views illustrating a method of fabricating the organic light emitting display shown in FIG. 7.
Figure 8A:
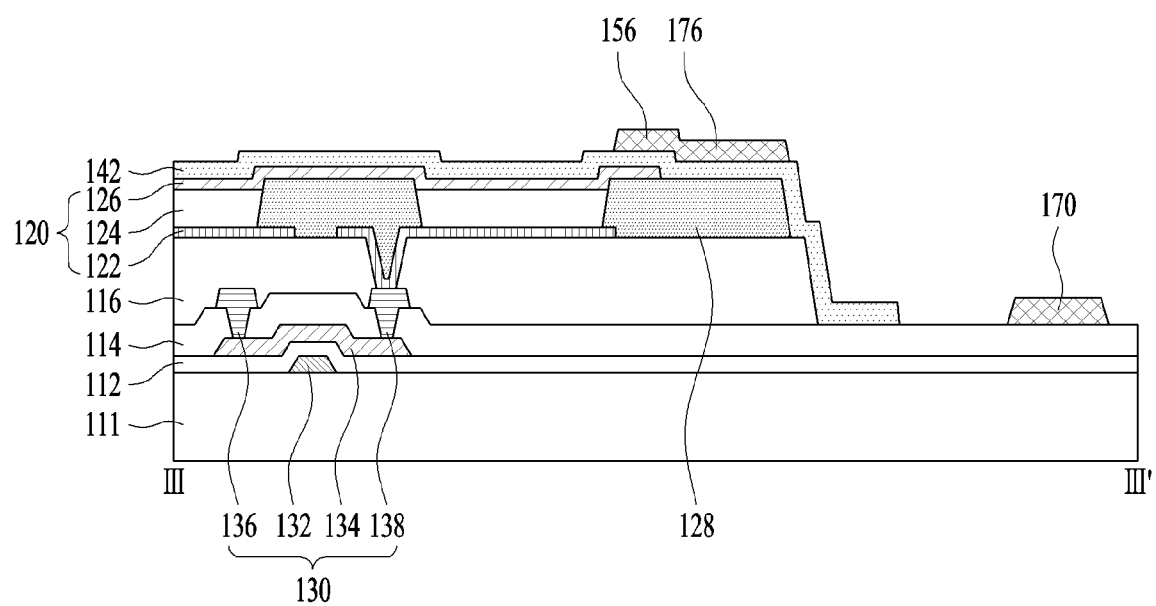

With reference to FIG. 8A, the first inorganic encapsulation layer 142 is formed on the substrate 111 provided with the switching thin film transistors, the driving thin film transistors 130, the anodes 122, the organic light emitting layer 124 and the cathodes 126 formed thereon, the touch pads 170 are formed on at least one of the substrate 111, the gate insulating layer 112 and the interlayer insulating layer 114, and the routing pads 176 and the routing lines 156 are formed on the first inorganic encapsulation layer 142.

In more detail, the first inorganic encapsulation layer 142 is formed by stacking an inorganic insulating material on the substrate 111, provided with the switching thin film transistors, the driving thin film transistors 130, the anodes 122, the organic light emitting layer 124 and the cathodes 126 formed thereon, through a deposition process using a mask such as a metal mask. Here, the first inorganic encapsulation layer 142 is formed in other regions except for regions in which the touch pads 170 will be formed. Thereafter, a first conductive layer is deposited on the whole surface of the first inorganic encapsulation layer 142 and on exposed regions of the substrate 111, the gate insulating layer 112 and/or the interlayer insulating layer 114, and the touch pads 170, the routing pads 176 and the routing lines 156 are formed by patterning the first conductive layer through a photolithography process and an etching process. Here, the first conductive layer is formed to have a monolayer structure or a multilayer structure using metals having high corrosion resistance and high acid resistance, such as Ta, Al, Ti, Cu and Mo. That is, the first conductive layer may have a monolayer structure or multilayer structure including one or more of Ta, Al, Ti, Cu and Mo. For example, the first conductive layer has a tri-layer structure, such as Ti/Al/Ti or Mo/Al/Mo.

Figure 8B:
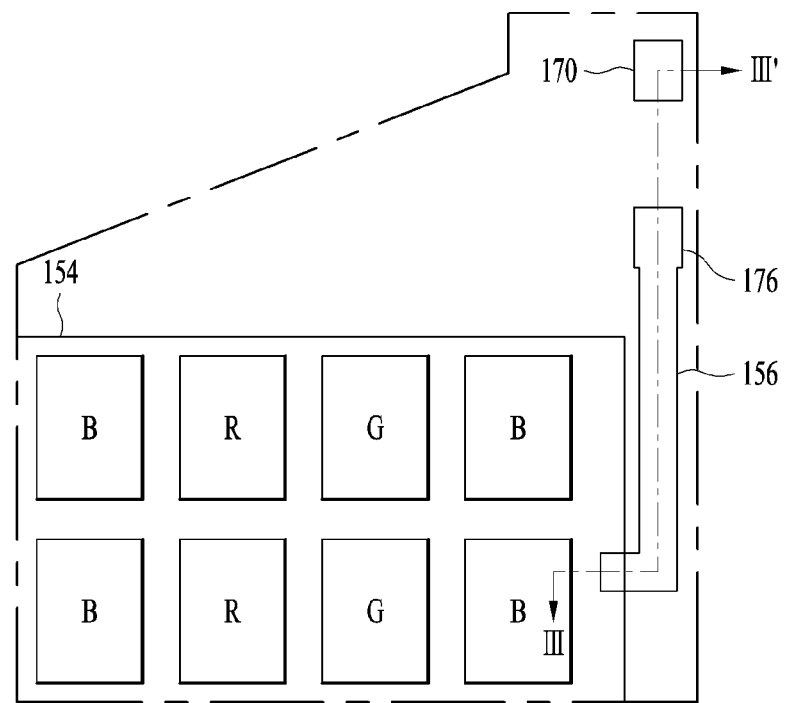
Figure 8B:
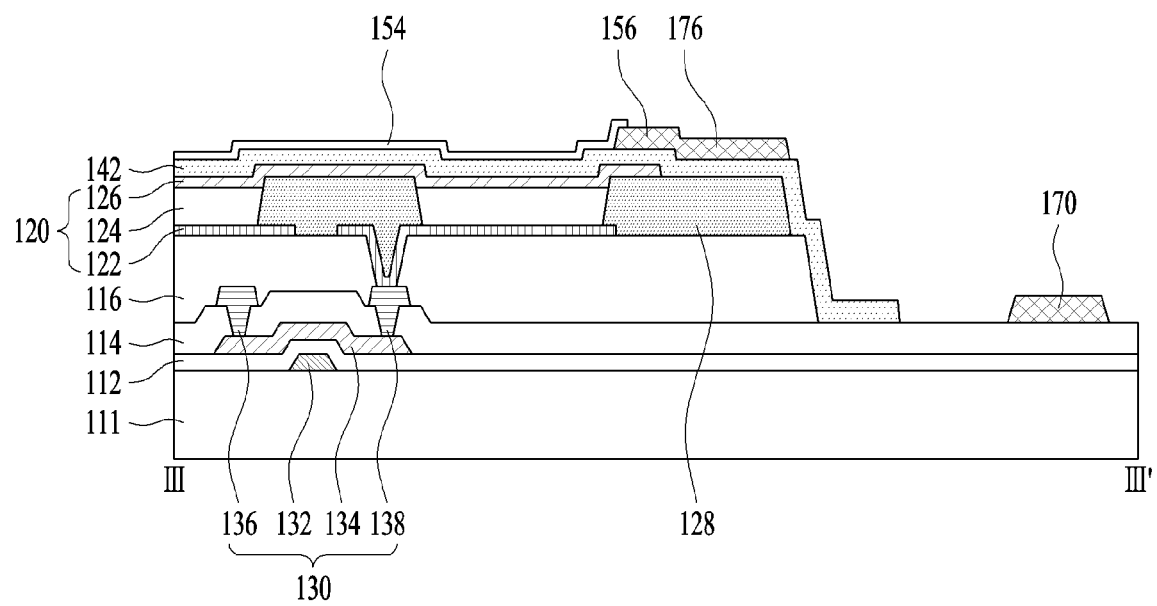

With reference to FIG. 8B, the touch electrodes 154 are formed on the substrate 111 provided with the touch pads 170, the routing pads 176 and the routing lines 156 formed thereon.

In more detail, a second conductive layer is deposited on the whole surface of the substrate 111 provided with the touch pads 170, the routing pads 176 and the routing lines 156 formed thereon, and the touch electrodes 154 are formed by patterning the second conductive layer through a photolithography process and an etching process. Here, the touch electrodes 154 are formed of a transparent conductive layer, such as ITO, IZO, IGZO or ZnO.

Figure 8C:
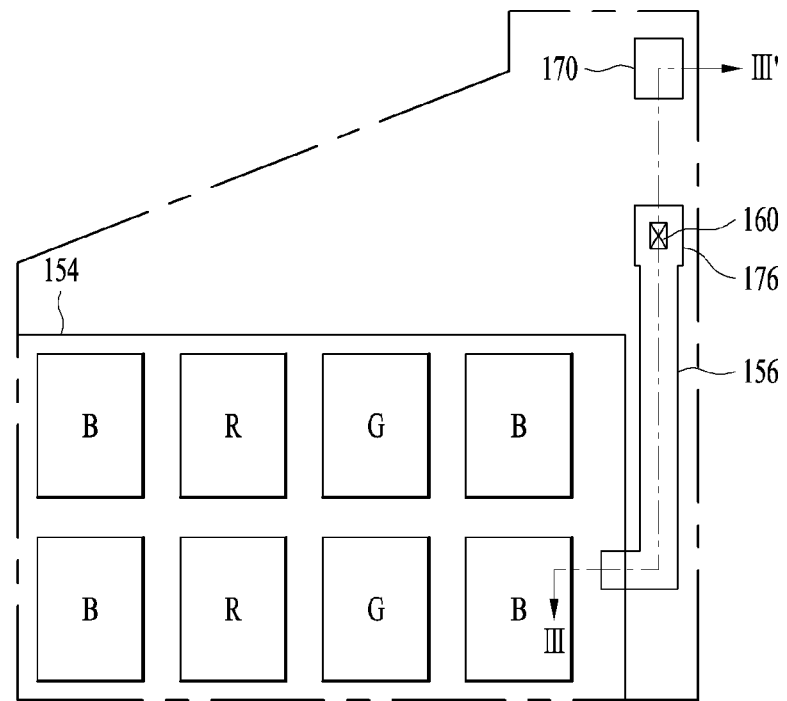
Figure 8C:
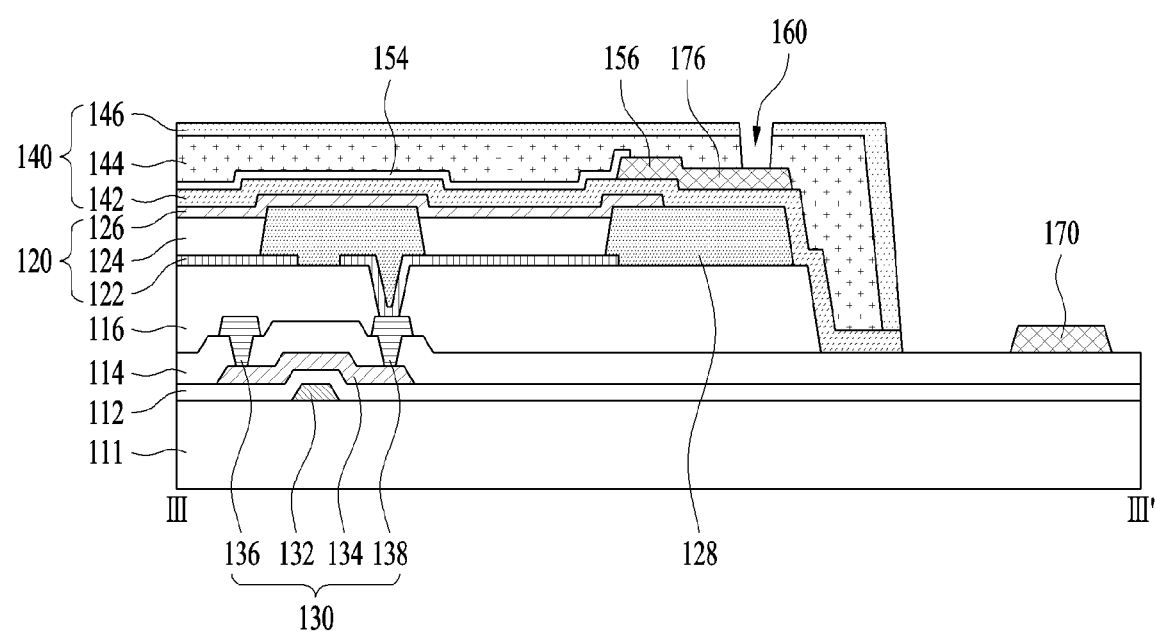

With reference to FIG. 8C, the organic encapsulation layer 144 and the second inorganic encapsulation layer 146 having the pad contact holes 160 are formed on the substrate 111 provided with the touch electrodes 154 formed thereon.

In more detail, the organic encapsulation layer 144 and the second inorganic encapsulation layer 146 are formed by sequentially depositing an organic insulating material and an inorganic insulating material on the substrate 111 provided with the touch electrodes 154 formed thereon through a deposition process using a metal mask to expose the touch pads 170. Thereafter, the pad contact holes 160 are formed by patterning the organic encapsulation layer 144 and the second inorganic encapsulation layer 146 through a photolithography process and an etching process. The pad contact holes 160 are formed through the organic encapsulation layer 144 and the second inorganic encapsulation layer 146 and thus expose the routing pads 176.

Figure 8D:
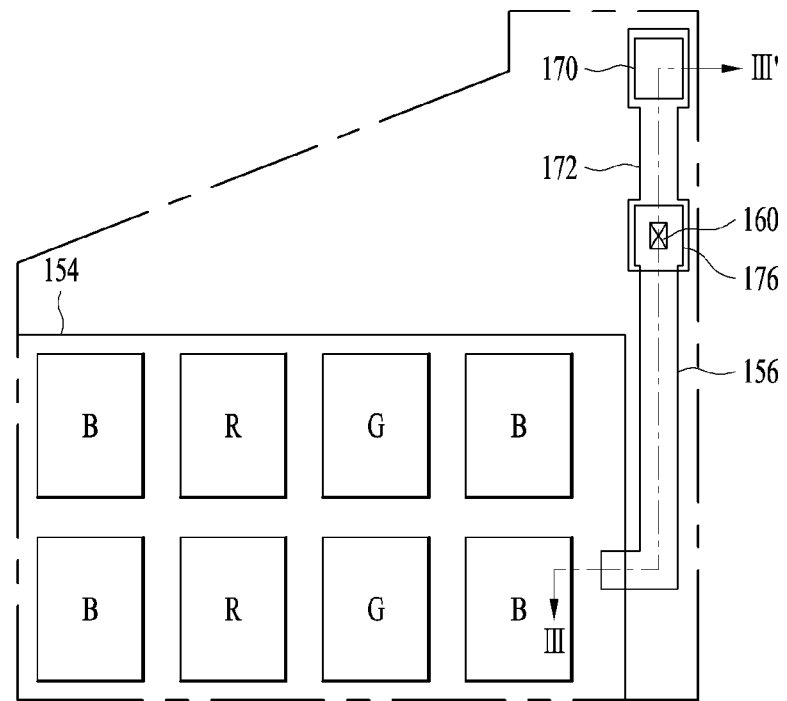
Figure 8D:
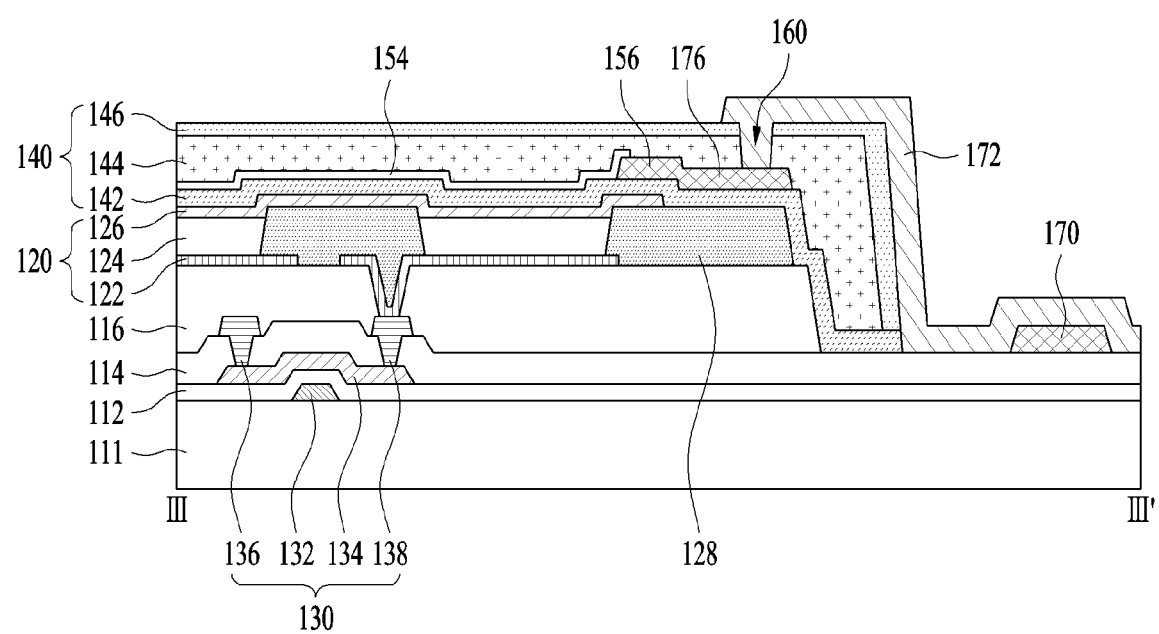

With reference to FIG. 8D, the pad connection electrodes 172 are formed on the substrate 111 provided with the pad contact holes 160.

In more detail, a third conductive layer is deposited on the whole surface of the substrate 111 provided with the second inorganic encapsulation layer 146 formed thereon. Here, the third conductive layer is formed to have a monolayer structure or a multilayer structure using metals having high corrosion resistance and high acid resistance, such as Ta, Al, Ti, Cu and Mo. That is, the third conductive layer may have a monolayer structure or multilayer structure including one or more of Ta, Al, Ti, Cu and Mo. For example, the third conductive layer has a tri-layer structure, such as Ti/Al/Ti or Mo/Al/Mo. Thereafter, the pad connection electrodes 172 are formed by patterning the third conductive layer through a photolithography process and an etching process. Here, the pad connection electrodes 172 are conductively connected to the routing pads 176 exposed through the pad contact holes 160, and are directly connected to the touch pads 170 without contact holes.

Figure 9:
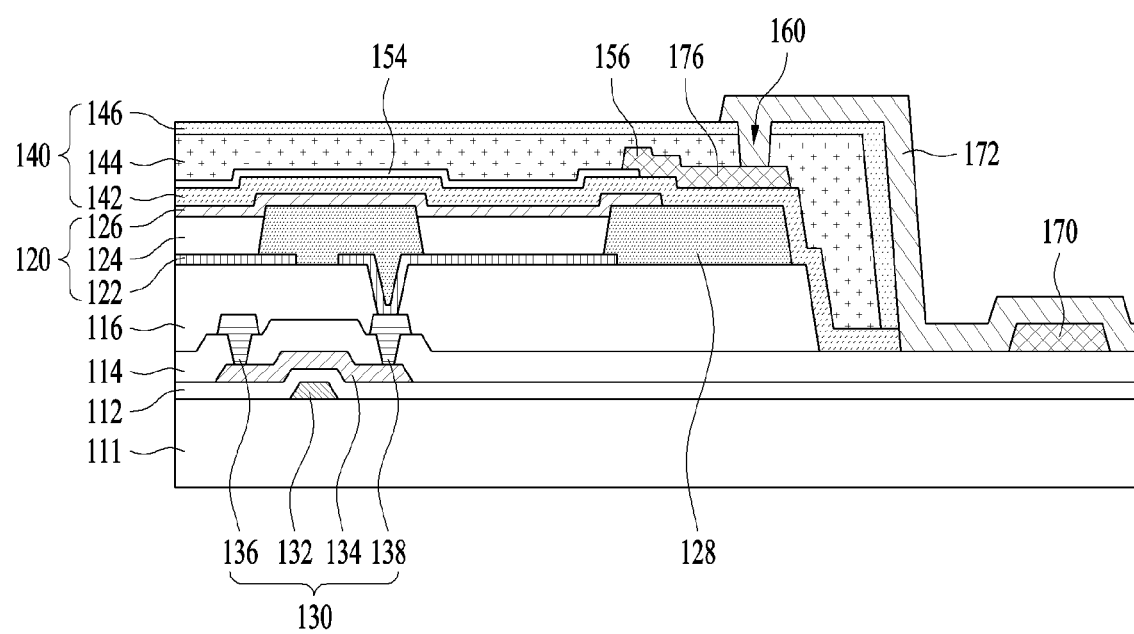
FIG. 9 is a cross-sectional view of an organic light emitting display having touch sensors in accordance with another embodiment of the present invention.

Although the above embodiments of the present invention exemplarily describe that the routing lines 156 and the touch pads 170 formed of a first conductive layer are formed first and the touch electrodes 154 formed of a second conductive layer are then formed, the touch electrodes 154 formed of the second conductive layer may be formed first and the routing lines 156 and the touch pads 170 formed of the first conductive layer may then be formed, as exemplarily shown in FIG. 9.

Figure 10:
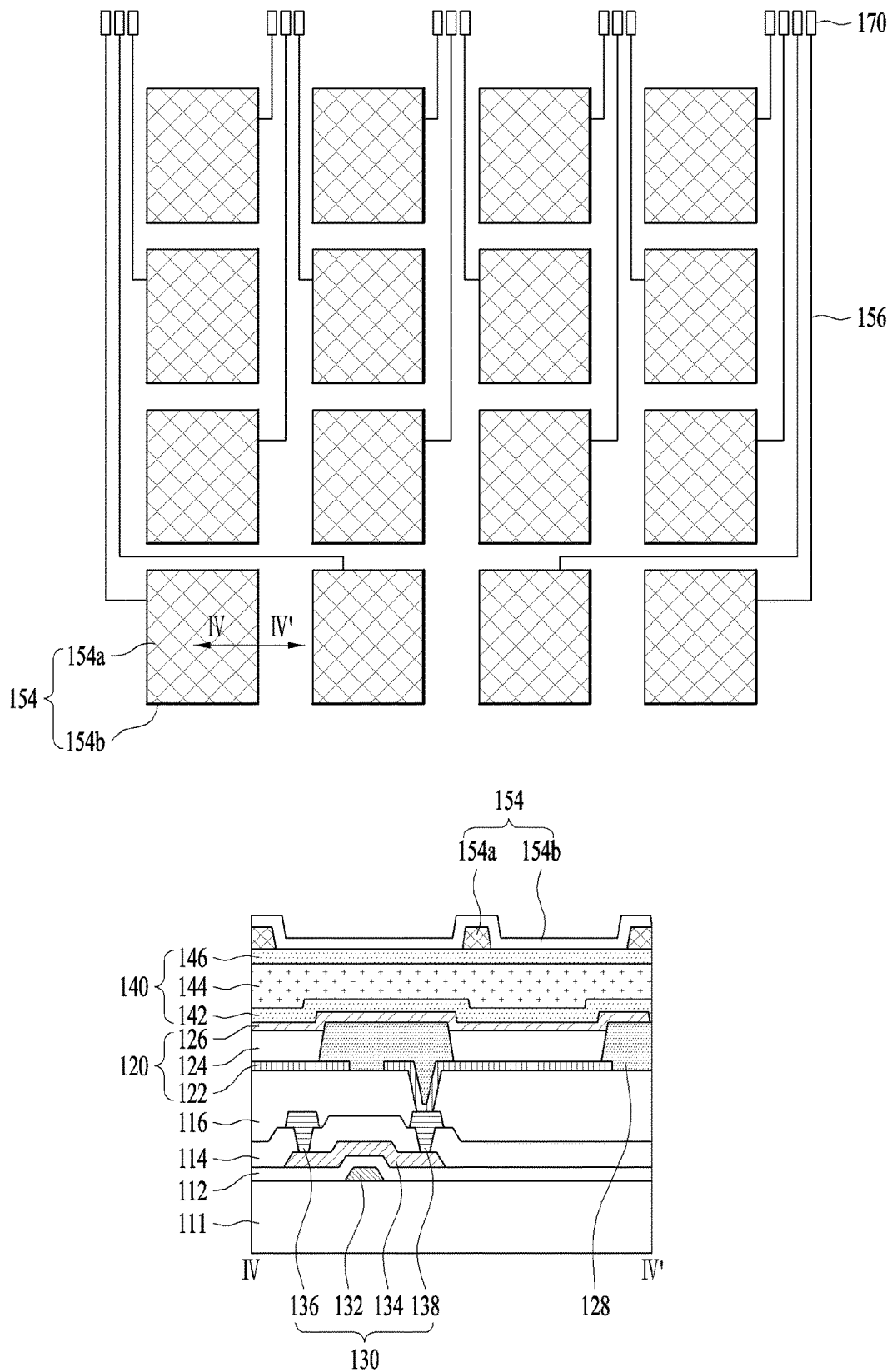
FIG. 10 is plan and cross-sectional views of an organic light emitting display having touch sensors in accordance with another embodiment of the present invention

Further, although the above embodiments of the present invention exemplarily describe the touch electrodes 154 as being formed of a transparent conductive layer, the touch electrodes 154 may include a transparent conductive layer 154b and a mesh metal layer 154a formed in a mesh type on the upper or lower surface of the transparent conductive layer 154b, as exemplarily shown in FIG. 10. Otherwise, the touch electrodes 154 may include a mesh metal layer 154a without a transparent conductive layer 154b. Here, the mesh metal layer 154a has higher conductivity than the transparent conductive layer 154b and may thus form low-resistance electrodes as the touch electrodes 154. Thereby, resistances and capacitances of the touch electrodes 154 are reduced and a time constant RC is reduced, thus improving touch sensitivity. Further, the mesh metal layer 154a has a very thin line width and may thus prevent an aperture ratio and transmittance from being lowered due to the mesh metal layer 154a.

Figure 11:
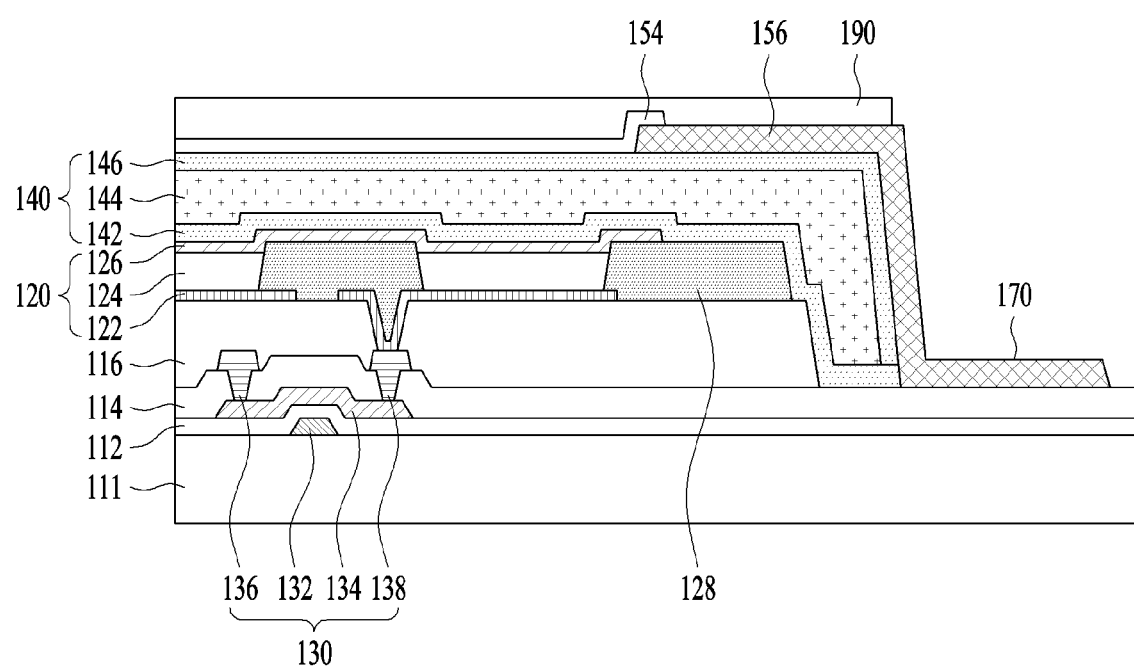
FIG. 11 is a cross-sectional view of an organic light emitting display having touch sensors in accordance with yet another embodiment of the present invention.

Moreover, the touch sensors included in the organic light emitting displays in accordance with the above embodiments of the present invention may be protected by a protective layer 190, as exemplarily shown in FIG. 11. As the protective layer 190, a circularly polarizing plate may be used, a separate monolayer formed of epoxy or acrylic may be used, or a multilayer structure including an overcoating layer, a barrier layer, a hard coating layer and a protective layer may be used. Such a protective layer 190 may be formed on the encapsulation part 140 through a deposition process or be attached to the encapsulation part 140 through an adhesive layer formed in the protective layer 190.

As apparent from the above description, an organic light emitting display having touch sensors in accordance with various embodiments of the present invention includes touch electrodes disposed on at least one of a first inorganic encapsulation layer, an organic encapsulation layer and a second inorganic encapsulation layer included in an encapsulation part. Therefore, the organic light emitting display in accordance with the present invention does not require a touch insulating layer of a conventional touchscreen and may thus achieve structure simplification and thickness reduction, thus achieving weight reduction and slimming. Further, the organic light emitting display in accordance with the present invention may assure flexibility and enhance transmittance. Moreover, the organic light emitting display in accordance with the present invention disposes the touch electrodes on an encapsulation layer of the encapsulation part and does not require a separate attachment process, thereby simplifying the overall process and reducing manufacturing costs.

Various aspects of this disclosure will be described further below:

Example 1 is a display device. The display device may include light emitting devices disposed on a substrate, an encapsulation layer structure disposed on the light emitting devices, and a touch sensor. The touch sensor may include a plurality of touch sensing electrodes disposed on the encapsulation layer structure along a first direction, and a plurality of touch driving electrodes on the encapsulation layer structure and in a same plane as the plurality of touch sensing electrodes, the plurality of touch driving electrodes disposed along the first direction and in parallel with the plurality of touch sensing electrode. The display device may further include at least one routing line disposed on the encapsulation layer structure and connected to the touch sensor. The at least one routing line is running along at least one sidewall of the encapsulation layer structure.

In Example 2, the subject matter of Example 1 can optionally include that the at least one routing line is deposited on the encapsulation layer structure.

In Example 3, the subject matter of any one of Examples 1 or 2 can optionally include that the encapsulation layer structure is free of an adhesive.

In Example 4, the subject matter of any one of Examples 1 to 3 can optionally include that at least a portion of the at least one routing line is in physical contact with the at least one sidewall of the encapsulation layer structure.

In Example 5, the subject matter of any one of Examples 1 to 4 can optionally include that the display device further includes a plurality of touch pads disposed in a pad region of the substrate. The at least one routing line running between a respective touch sensor and a respective touch pad is made of the same material.

In Example 6, the subject matter of any one of Examples 1 to 5 can optionally include that the encapsulation layer structure includes a plurality of inorganic encapsulation layers and at least one organic encapsulation layer disposed between the inorganic encapsulation layers.

In Example 7, the subject matter of Example 6 can optionally include that the touch sensor is disposed on an inorganic encapsulation layer, which is the uppermost layer of the encapsulation layer structure, and the plurality of routing lines is disposed on the side and upper surfaces of the inorganic encapsulation layer, which is the uppermost layer of the encapsulation layer structure.

In Example 8, the subject matter of any one of Examples 6 or 7 can optionally include that the display device further includes a routing pad disposed between the routing line and a touch pad, at least one pad contact hole penetrating at least a portion of the encapsulation layer structure, and a pad connection electrode electrically connecting the routing pad exposed through the pad contact hole to the touch pad.

In Example 9, the subject matter of any one of Examples 6 and 8 can optionally include that the at least one pad contact hole penetrates at least one of the inorganic encapsulation layer of the encapsulation layer structure.

In Example 10, the subject matter of any one of Examples 6 and 8 can optionally include that the at least one pad contact hole penetrates at least one of the inorganic encapsulation layer, which is the uppermost layer of the encapsulation layer structure, and the organic encapsulation layer of the encapsulation layer structure.

In Example 11, the subject matter of any one of Examples 9 or 10 can optionally include that the pad connection electrode is disposed on the side and upper surfaces of the inorganic encapsulation layer, which is the uppermost layer of the encapsulation part, and that the touch sensor and the routing lines are disposed on the remaining encapsulation layers other than the inorganic encapsulation layer, which is the uppermost layer of the encapsulation part.

In Example 12, the subject matter of any one of Examples 1 to 11 can optionally include that the touch sensor is formed in a mesh type.

In Example 13, the subject matter of Example 12 can optionally include that the touch sensor includes a transparent conductive layer and a mesh metal layer formed in a mesh type on the upper or lower surface of the transparent conductive layer.

In Example 14, the subject matter of any one of Examples 8 to 13 can optionally include that the at least one pad contact hole includes a plurality of pad contact holes penetrating the encapsulation layer structure.

In Example 15, the subject matter of any one of Examples 8 to 14 can optionally include that the display device further includes a bank. The at least one pad contact hole is arranged to (laterally) overlap the bank.

In Example 16, the subject matter of any one of Examples 1 to 15 can optionally include that the touch pad and the routing line are formed of a first conductive layer having a monolayer structure or a multilayer structure including at least one of Ta, Al, Ti, Cu and Mo.

In Example 17, the subject matter of Example 16 can optionally include that the touch sensor is formed of a second conductive layer including a transparent conductive oxide.

In Example 18, the subject matter of Example 17 can optionally include that the transparent conductive oxide includes an ITO, IZO, IGZO or ZnO-based transparent conductive oxide.

In Example 19, the subject matter of any one of Examples 16 to 18 can optionally include that the inorganic encapsulation layers are formed of silicon nitride, silicon oxide, silicon oxynitride or aluminum oxide.

In Example 20, the subject matter of any one of Examples 16 to 19 can optionally include that the organic encapsulation layer is formed of acrylic resin, epoxy resin or a polymeric resin.

Example 21 is a method of manufacturing a display device. The method may include forming light emitting devices on a substrate, forming an encapsulation layer structure on the light emitting devices, and forming a touch sensor. The forming of the touch sensor may include forming a plurality of touch sensing electrodes on the encapsulation layer structure along a first direction, forming a plurality of touch driving electrodes on the encapsulation layer structure and in a same plane as the plurality of touch sensing electrodes, and forming the plurality of touch driving electrodes along the first direction and in parallel with the plurality of touch sensing electrodes. The method may further include forming at least one routing line on the encapsulation layer structure and connected to the touch sensor. The at least one routing line is running along at least one sidewall of the encapsulation layer structure.

In Example 22, the subject matter of Example 21 can optionally include that the at least one routing line is deposited on the encapsulation layer structure.

In Example 23, the subject matter of any one of Examples 21 or 22 can optionally include that the encapsulation layer structure is formed free of an adhesive.

In Example 24, the subject matter of any one of Examples 21 to 23 can optionally include that at least a portion of the at least one routing line is formed in physical contact with the at least one sidewall of the encapsulation layer structure.

In Example 25, the subject matter of any one of Examples 21 to 24 can optionally include that the method further includes forming a plurality of touch pads in a pad region of the substrate. The at least one routing line running between a respective touch sensor and a respective touch pad is made of the same material.

In Example 26, the subject matter of any one of Examples 21 to 25 can optionally include that the encapsulation layer structure includes a plurality of inorganic encapsulation layers and at least one organic encapsulation layer disposed between the inorganic encapsulation layers.

In Example 27, the subject matter of Example 26 can optionally include that the touch sensor is formed on an inorganic encapsulation layer, which is the uppermost layer of the encapsulation layer structure, and the plurality of routing lines is formed on the side and upper surfaces of the inorganic encapsulation layer, which is the uppermost layer of the encapsulation layer structure.

In Example 28, the subject matter of any one of Examples 26 or 27 can optionally include that the method further includes forming a routing pad disposed between the routing line and a touch pad, forming at least one pad contact hole penetrating at least a portion of the encapsulation layer structure, and forming a pad connection electrode electrically connecting the routing pad exposed through the pad contact hole to the touch pad.

In Example 29, the subject matter of any one of Examples 26 and 28 can optionally include that the at least one pad contact hole penetrates at least one of the inorganic encapsulation layer of the encapsulation layer structure.

In Example 30, the subject matter of any one of Examples 26 and 28 can optionally include that the at least one pad contact hole penetrates at least one of the inorganic encapsulation layer, which is the uppermost layer of the encapsulation layer structure, and the organic encapsulation layer of the encapsulation layer structure.

In Example 31, the subject matter of any one of Examples 29 or 30 can optionally include that the pad connection electrode is formed on the side and upper surfaces of the inorganic encapsulation layer, which is the uppermost layer of the encapsulation part, and that the touch sensor and the routing lines are formed on the remaining encapsulation layers other than the inorganic encapsulation layer, which is the uppermost layer of the encapsulation part.

In Example 32, the subject matter of any one of Examples 21 to 31 can optionally include that the touch sensor is formed in a mesh type.

In Example 33, the subject matter of Example 32 can optionally include that the method further includes forming a transparent conductive layer and a mesh metal layer formed in a mesh type on the upper or lower surface of the transparent conductive layer.

In Example 34, the subject matter of any one of Examples 28 to 33 can optionally include that the at least one pad contact hole includes a plurality of pad contact holes penetrating the encapsulation layer structure.

In Example 35, the subject matter of any one of Examples 28 to 34 can optionally include that the method further includes forming a bank. The at least one pad contact hole is arranged to (laterally) overlap the bank.

In Example 36, the subject matter of any one of Examples 21 to 35 can optionally include that the touch pad and the routing line are formed of a first conductive layer having a monolayer structure or a multilayer structure including at least one of Ta, Al, Ti, Cu and Mo.

In Example 37, the subject matter of Example 36 can optionally include that the touch sensor is formed of a second conductive layer including a transparent conductive oxide.

In Example 38, the subject matter of Example 37 can optionally include that the transparent conductive oxide includes an ITO, IZO, IGZO or ZnO-based transparent conductive oxide.

In Example 39, the subject matter of any one of Examples 36 to 38 can optionally include that the inorganic encapsulation layers are formed of silicon nitride, silicon oxide, silicon oxynitride or aluminum oxide.

In Example 40, the subject matter of any one of Examples 36 to 39 can optionally include that the organic encapsulation layer is formed of acrylic resin, epoxy resin or a polymeric resin.

What is claimed is:

1. A display device comprising:
   light emitting devices disposed on a substrate;
   an encapsulation layer disposed on the light emitting devices;
   a touch sensor including a plurality of touch electrodes, the plurality of touch electrodes on the encapsulation layer;
   a bank; and
   at least one routing line disposed between the encapsulation layer and the touch sensor and connected to the touch sensor, a first portion of the at least one routing line is above and overlapping the bank and a second portion of the at least one routing line is along at least one sidewall of the encapsulation layer.

2. The display device of claim 1, wherein the at least one routing line is on the encapsulation layer.

3. The display device of claim 1, further comprising:
   a first inorganic layer between the touch sensor and the encapsulation layer.

4. The display device of claim 3, wherein the first inorganic layer comprises at least one of silicon nitride (SiNx), silicon oxide (SiOx), silicon oxynitride (SiON), or aluminum oxide (Al2O3).

5. The display device of claim 3, wherein the encapsulation layer comprises a second inorganic layer and an organic layer.

6. The display device of claim 5, wherein the at least one routing line is disposed on a side and an upper surface of the encapsulation layer.

7. The display device of claim 6, further comprising:
   a routing pad disposed between the at least one routing line and a touch pad;
   a pad connection electrode electrically connecting the routing pad to the touch pad.

8. The display device of claim 7, further comprising:
   at least one pad contact hole that penetrates at least the first inorganic layer, the first inorganic layer on the organic layer of the encapsulation layer.

9. The display device of claim 8, wherein the pad connection electrode is disposed on the side surface and the upper surface of the first inorganic layer.

10. The display device of claim 9, wherein the touch sensor and the at least one routing line are disposed on the encapsulation layer.

11. The display device of claim 7, wherein the at least one pad contact hole comprises a plurality of pad contact holes penetrating the encapsulation layer.

12. The display device of claim 7, wherein the at least one routing line is disposed on a bank.

13. The display device of claim 1, wherein at least a portion of the at least one routing line is in physical contact with the at least one sidewall of the encapsulation layer.

14. The display device of claim 1 further comprising:
    a plurality of touch pads disposed in a pad region of the substrate;
    wherein the at least one routing line is between the touch sensor and one of the plurality of touch pads.

15. The display device of claim 14, wherein the at least one routing line and the one of the plurality of touch pads is made of a same material.

16. The display device of claim 15, wherein the material is a multi-layer structure including titanium, aluminum, and titanium or molybdenum, aluminum, and molybdenum.

17. The display device of claim 1, wherein the touch sensor is a mesh type.

18. The display device of claim 1, wherein the display device is flexible.

19. The display device of claim 1, wherein the encapsulation layer comprises a first inorganic layer and a second inorganic layer;
    wherein the second inorganic layer exposes a side surface of the first inorganic layer.

20. A display device comprising:
    light emitting devices disposed on a substrate;
    an encapsulation layer disposed on the light emitting devices;
    a touch sensor including a plurality of touch electrodes, the plurality of touch electrodes on the encapsulation layer;
    a first routing line disposed between the encapsulation layer and the touch sensor and connected to the touch sensor, the first routing line including a routing line and a routing pad extended from the routing line;
    a second routing line disposed over a portion of the first routing line, the second routing line in physical contact with the routing pad of the first routing line; and a touch pad electrically connected to at least one of the first routing line or the second routing line.

21. The display device of claim 20, wherein at least one of the first routing line or the second routing line is along at least one sidewall of the encapsulation layer.

22. The display device of claim 21, wherein at least one of the first routing line or the second routing line is in physical contact with the at least one sidewall of the encapsulation layer.

23. The display device of claim 20, wherein the at least one of the first routing line or the second routing line on the encapsulation layer.

24. The display device of claim 20, further comprising:
a first inorganic layer between the touch sensor and the encapsulation layer.

25. The display device of claim 24, wherein the first inorganic layer comprises at least one of silicon nitride (SiNx), silicon oxide (SiOx), silicon oxynitride (SiON), or aluminum oxide (Al2O3).

26. The display device of claim 24, wherein the encapsulation layer comprises a second inorganic layer and an organic layer.

27. The display device of claim 26, further comprising:
at least one pad contact hole that penetrates at least the first inorganic layer, the first inorganic layer on the organic layer of the encapsulation layer.

28. The display device of claim 27, wherein the pad connection electrode is disposed on the side surface and the upper surface of the first inorganic layer.

29. The display device of claim 28, wherein the touch sensor and the at least one routing line are disposed on the encapsulation layer.

30. The display device of claim 27, wherein the at least one pad contact hole comprises a plurality of pad contact holes penetrating the encapsulation layer.

31. The display device of claim 24, wherein at least one of the first routing line or the second routing line is disposed on a side surface and an upper surface of the encapsulation layer.

32. The display device of claim 31, further comprising:
a routing pad disposed between at least one of the first routing line or second routing line and a touch pad;
a pad connection electrode electrically connecting the routing pad to the touch pad.

33. The display device of claim 32, further comprising:
a bank;
wherein at least one of the first routing line or the second routine line overlaps the bank.

34. The display device of claim 32, wherein the at least one routing line is disposed on a bank.

35. The display device of claim 20, further comprising:
a plurality of touch pads disposed in a pad region of the substrate;
wherein at least one of the first routing line or the second routing line is between the touch sensor and one of the plurality of touch pads.

36. The display device of claim 35, wherein at least one of the first routing line or the second routing line and the one of the plurality of touch pads is made of a same material.

37. The display device of claim 36, wherein the material is a multi-layer structure including titanium, aluminum, and titanium or molybdenum, aluminum, and molybdenum.

38. The display device of claim 20, wherein the touch sensor is a mesh type.

39. The display device of claim 20, wherein the display device is flexible.

* * * * *